(12) United States Patent
Kikkawa et al.

(10) Patent No.: US 9,142,658 B2
(45) Date of Patent: Sep. 22, 2015

(54) COMPOUND SEMICONDUCTOR DEVICE AND METHOD OF MANUFACTURING THE SAME

(71) Applicant: Transphorm Japan, Inc., Yokohama (JP)

(72) Inventors: Toshihide Kikkawa, Akiruno (JP); Kenji Nukui, Nakano (JP)

(73) Assignee: Transphorm Japan, Inc., Yokohama (JP)

(*) Notice: Subject to any disclaimer, the term of this patent is extended or adjusted under 35 U.S.C. 154(b) by 10 days.

(21) Appl. No.: 14/032,493

(22) Filed: Sep. 20, 2013

(65) Prior Publication Data

US 2014/0091365 A1 Apr. 3, 2014

(30) Foreign Application Priority Data

Sep. 28, 2012 (JP) ................................. 2012-217346

(51) Int. Cl.
| | |
|---|---|
| *H01L 29/778* | (2006.01) |
| *H01L 29/66* | (2006.01) |
| *H01L 29/417* | (2006.01) |
| *H01L 29/423* | (2006.01) |
| *H01L 29/20* | (2006.01) |

(52) U.S. Cl.
CPC ........ *H01L 29/778* (2013.01); *H01L 29/41725* (2013.01); *H01L 29/42316* (2013.01); *H01L 29/66431* (2013.01); *H01L 29/66462* (2013.01); *H01L 29/7787* (2013.01); *H01L 29/2003* (2013.01)

(58) Field of Classification Search
CPC .................... H01L 29/2003; H01L 29/66462; H01L 29/41725; H01L 29/778; H01L 29/41766; H01L 29/0891
See application file for complete search history.

(56) References Cited

U.S. PATENT DOCUMENTS

| | | | | |
|---|---|---|---|---|
| 7,923,753 | B2* | 4/2011 | Mita et al. | 257/192 |
| 8,507,920 | B2* | 8/2013 | Chen et al. | 257/76 |
| 8,697,505 | B2* | 4/2014 | Chen et al. | 438/167 |
| 8,928,037 | B2* | 1/2015 | Ramdani et al. | 257/192 |
| 2005/0087763 | A1* | 4/2005 | Kanda et al. | 257/192 |
| 2008/0079023 | A1 | 4/2008 | Hikita et al. | |
| 2009/0057720 | A1 | 3/2009 | Kaneko | |
| 2012/0161146 | A1 | 6/2012 | Shim | |
| 2013/0092958 | A1* | 4/2013 | Chen et al. | 257/77 |
| 2013/0193486 | A1* | 8/2013 | Kinoshita et al. | 257/194 |
| 2013/0316502 | A1* | 11/2013 | Mishra et al. | 438/172 |

FOREIGN PATENT DOCUMENTS

| | | |
|---|---|---|
| CN | 101185158 | 5/2008 |
| EP | 2 216 806 | 8/2010 |
| JP | 2012-134345 A1 | 7/2012 |

OTHER PUBLICATIONS

Office Action in TW Application No. 102132549, mailed May 21, 2015, 7 pages.

* cited by examiner

*Primary Examiner* — Jaehwan Oh
(74) *Attorney, Agent, or Firm* — Fish & Richardson P.C.

(57) ABSTRACT

A compound semiconductor device includes: a compound semiconductor layer; and a gate electrode formed above the compound semiconductor layer; and a source electrode and a drain electrode formed on both sides of the gate electrode, on the compound semiconductor layer, wherein the source electrode has a plurality of bottom surfaces along transit electrons out of contact surfaces with the compound semiconductor layer, and the plural bottom surfaces are located at different distances from the transit electrons, with the bottom surface closer to the gate electrode being more apart from the transit electrons.

8 Claims, 15 Drawing Sheets

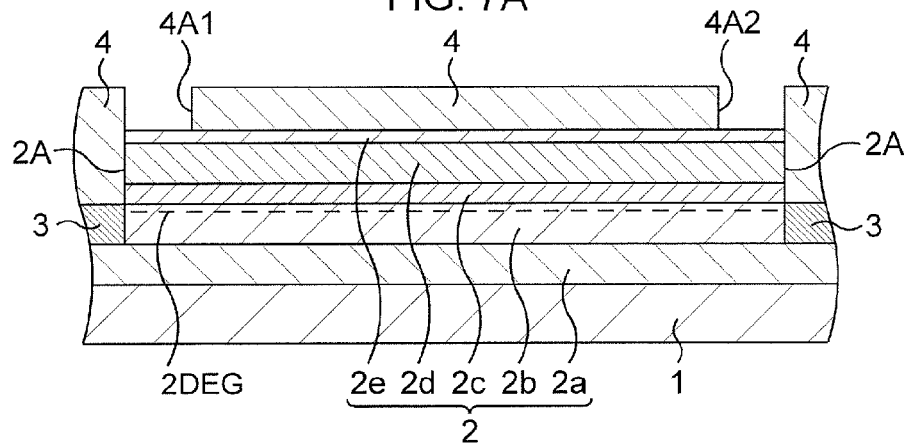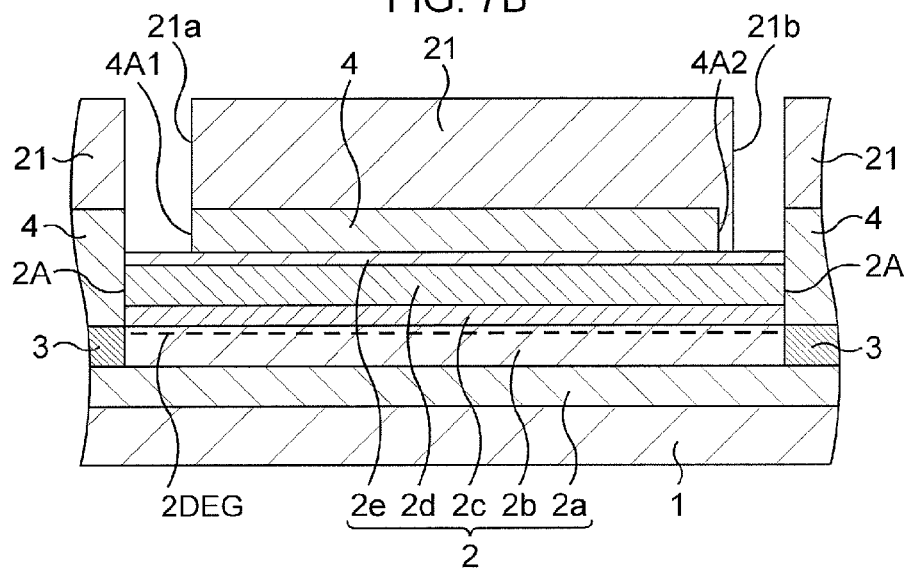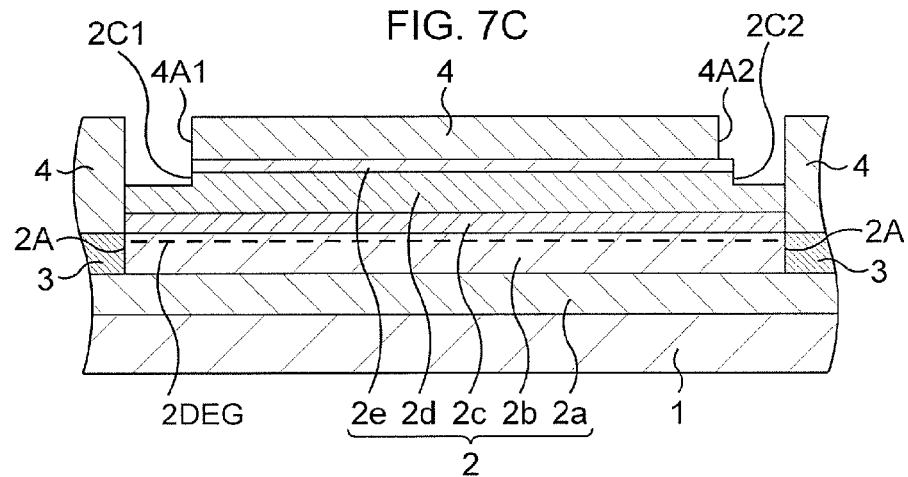

US 9,142,658 B2

COMPOUND SEMICONDUCTOR DEVICE AND METHOD OF MANUFACTURING THE SAME

CROSS-REFERENCE TO RELATED APPLICATION

This application is based upon and claims the benefit of priority of the prior Japanese Patent Application No. 2012-217346, filed on Sep. 28, 2012, the entire contents of which are incorporated herein by reference.

FIELD

The embodiments discussed herein are directed to a compound semiconductor device and a method of manufacturing the same.

BACKGROUND

Applying nitride semiconductors to high-withstand-voltage and high-power semiconductor devices by utilizing their characteristics such as a high saturation electron velocity and a wide band gap has been considered. For example, GaN being a nitride semiconductor has a band gap of 3.4 eV, which is wider than a band gap of Si (1.1 eV) and a band gap of GaAs (1.4 eV), and has high breakdown electric field intensity. This makes GaN very promising as a material of semiconductor devices for power supply realizing a high voltage operation and a high power.

Many reports have been made on field-effect transistors, in particular, HEMTs (High Electron Mobility Transistors) as semiconductor devices using nitride semiconductors. For example, among GaN-based HEMTs (GaN-HEMTs), an AlGaN/GaN HEMT using GaN as an electron transit layer and using AlGaN as an electron supply layer has been drawing attention. In the AlGaN/GaN HEMT, a distortion ascribable to a difference in lattice constant between GaN and AlGaN occurs in AlGaN. Owing to piezoelectric polarization caused by the distortion and spontaneous polarization of AlGaN, high-concentration two-dimensional electron gas (2DEG) is obtained. Therefore, the AlGaN/GaN HEMT is expected as a high-efficiency switch element or a high-withstand-voltage power device for electric vehicles and the like.

[Patent Document 1] Japanese Laid-open Patent Publication No. 2012-134345

A GaN-HEM is expected to have a high withstand voltage of, for example, 400 V or more. There has been a conventional concern about a breakdown of a gate electrode when a high voltage as above is applied to the GaN-HEMT. In recent years, it has come to be found out that a breakdown occurs also in a drain electrode in ohmic-contact with a nitride semiconductor. The breakdown of the drain electrode is ascribable to electric field concentration occurring on an end of the drain electrode. Consequently, electrons and holes are simultaneously generated by an avalanche effect, and the electrons and the holes further continuously cause the cumulative generation of electrons and holes, so that a current rapidly increases to cause the breakdown in the drain electrode. It has been confirmed that this breakdown of the drain electrode occurs both when a recess is formed in the nitride semiconductor and the drain electrode is formed in the recess and when the drain electrode is formed on the nitride semiconductor without a recess being formed.

SUMMARY

A compound semiconductor device according to an aspect includes: a compound semiconductor layer; and a pair of electrodes formed on an upper side of the compound semiconductor layer, wherein one of the pair of electrodes has a plurality of bottom surfaces along transit electrons out of contact surfaces with the compound semiconductor layer, and the plural bottom surfaces are located at different distances from the transit electrons, with the bottom surface closer to the other of the pair of electrodes being more apart from the transit electrons.

A method of manufacturing a compound semiconductor device according to an aspect includes: forming a compound semiconductor layer; and forming a pair of electrodes on an upper side of the compound semiconductor layer, wherein one of the pair of electrodes has a plurality of bottom surfaces along transit electrons out of contact surfaces with the compound semiconductor layer, and the plural bottom surfaces are located at different distances from the transit electrons, with the bottom surface closer to the other of the pair of electrodes being more apart from the transit electrons.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 7A to FIG. 7C are schematic cross-sectional views illustrating main steps of a method of manufacturing an AlGaN/GaN HEMT according to a second embodiment.

DESCRIPTION OF EMBODIMENTS

First Embodiment

In this embodiment, an AlGaN/GaN HEMT of a nitride semiconductor is disclosed as the compound semiconductor device.

FIG. 1A to FIG. 3C are schematic cross-sectional views illustrating a method of manufacturing the AlGaN/GaN HEMT according to the first embodiment in order of steps.

Figure 1A:
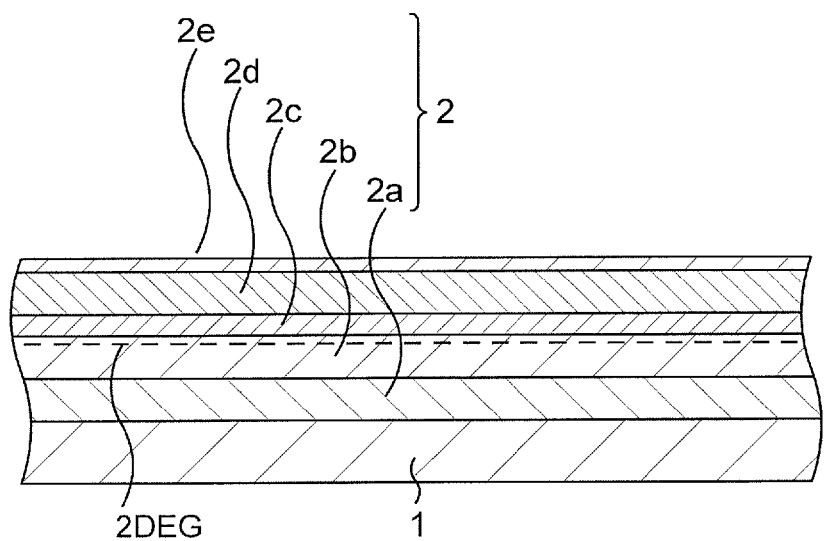
FIG. 1A to FIG. 1C are schematic cross-sectional views illustrating a method of manufacturing an AlGaN/GaN HEMT according to a first embodiment in order of steps.

First, as illustrated in FIG. 1A, a compound semiconductor stacked structure 2 is formed on, for example, a Si substrate 1 as a growth substrate. As the growth substrate, a SiC substrate, a sapphire substrate, a GaAs substrate, a GaN substrate, or the like may be used instead of the Si substrate. Conductivity of the substrate may be either semi-insulating or conductive.

The compound semiconductor stacked structure 2 includes a buffer layer 2a, an electron transit layer 2b, an intermediate layer 2c, an electron supply layer 2d, and a cap layer 2e.

Two-dimensional electron gas (2DEG) being transit electrons is generated in the vicinity of an interface of the electron transit layer 2b, with the electron supply layer 2d (to be exact, the intermediate layer 2c). This 2DEG is generated based on a difference in lattice constant between a compound semiconductor (here GaN) of the electron transit layer 2b and a compound semiconductor (here AlGaN) of the electron supply layer 2d.

In more detail, on the Si substrate 1, the following compound semiconductors are grown by, for example, a MOVPE (Metal Organic Vapor Phase Epitaxy) method. A MBE (Molecular Beam Epitaxy) method or the like may be used instead of the MOVPE method.

On the Si substrate 1, AlN with an about 100 nm thickness, i (intentionally undoped)-GaN with an about 1 μm thickness, i-AlGaN with an about 5 nm thickness, n-AlGaN with an about 30 nm thickness whose Al composition is, for instance, about 20%, and n-GaN with an about 3 nm thickness are sequentially grown. Consequently, the buffer layer 2a, the electron transit layer 2b, the intermediate layer 2c, the electron supply layer 2d, and the cap layer 2e are formed. As the buffer layer 2a, AlGaN may be used instead of AlN, or GaN may be grown by low-temperature growth.

As a growth condition of AlN, mixed gas of trimethylaluminum (TMA) gas and ammonia ($NH_3$) gas is used as source gas. As a growth condition of GaN, mixed gas of trimethylgallium (TMG) gas and $NH_3$ gas is used as source gas. As a growth condition of AlGaN, mixed gas of TMA gas, TMG gas, and $NH_3$ gas is used as source gas. Depending on the compound semiconductor layer that is to be grown, whether or not to supply the TMA gas being an Al source and the TMG gas being a Ga source and their flow rates are appropriately set. A flow rate of the $NH_3$ gas being a common source is set to about 100 ccm to about 10 LM. Further, growth pressure is set to about 50 Torr to about 300 Torr, and growth temperature is set to about 1000° C. to about 1200° C.

In order to grow n-AlGaN of the electron supply layer 2d and n-GaN of the cap layer 2e, for example, $SiH_4$ gas containing, for instance, Si is added as n-type impurities to the source gas at a predetermined flow rate, so that AlGaN and GaN are doped with Si. A doping concentration of Si is set to about $1\times10^{18}/cm^3$ to about $1\times10^{20}/cm^3$, for example, set to about $5\times10^{18}/cm^3$.

Figure 1B:
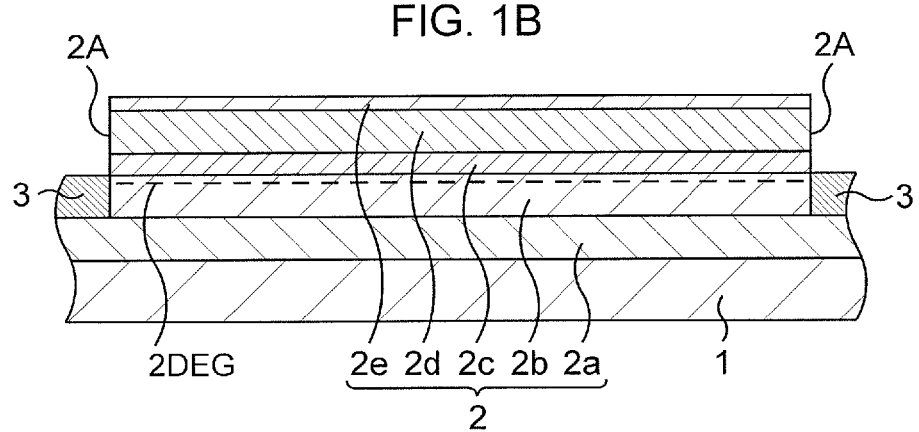

Subsequently, element isolation structures 3 are formed as illustrated in FIG. 1B.

In more detail, a resist is first applied on a surface of the compound semiconductor stacked structure 2. The resist is processed by lithography, whereby openings from which portions of the surface of the compound semiconductor stacked structure 2, corresponding to planned element isolation positions are exposed are formed in the resist. Consequently, a resist mask having the openings is formed.

By using this resist mask, the planned element isolation positions of the cap layer 2e, the electron supply layer 2d, and the intermediate layer 2c are dry-etched to be removed until a surface of the electron transit layer 2b is exposed. Consequently, element isolation recesses 2A from which the planned element isolation positions of the surface of the electron transit layer 2b are exposed are formed. As an etching condition, inert gas such as Ar and chlorine-based gas such as $Cl_2$ are used as etching gas.

By using the resist mask again, argon (Ar), for instance, is injected to element isolation regions of the electron transit layer 2b exposed from the openings. Consequently, the element isolation structures 3 are formed in the electron transit layer 2b. The element isolation structures 3 demarcate an active region on the compound semiconductor stacked structure 2.

Incidentally, instead of the above injection method, a STI (Shallow Trench Isolation) method, for instance, may be used for the element isolation. At this time, chlorine-based etching gas, for instance, is used for dry-etching of the compound semiconductor stacked structure 2.

The resist mask is removed by ashing using oxygen plasma or by wetting using a predetermined chemical solution.

Figure 1C:
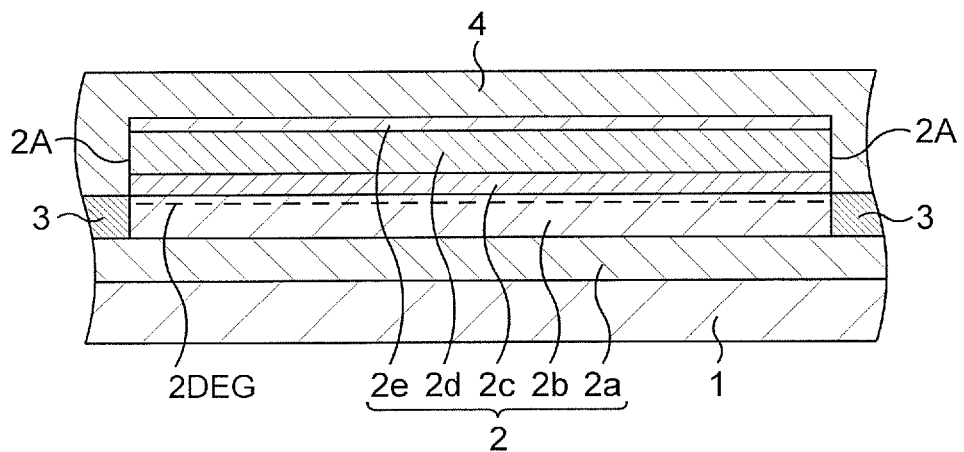

Subsequently, as illustrated in FIG. 1C, a protective insulating film 4 is formed.

In more detail, a silicon nitride (SiN) with a thickness of about 30 nm to about 500 nm, for example, about 60 nm is deposited on the compound semiconductor stacked structure 2 by a plasma CVD method, a sputtering method, or the like so as to fill the element isolation recesses 2A on the element isolation structures 3. Consequently, the protective insulating film 4 is formed.

The use of SiN for a passivation film covering the compound semiconductor stacked structure 2 can reduce a current collapse.

Figure 2A:
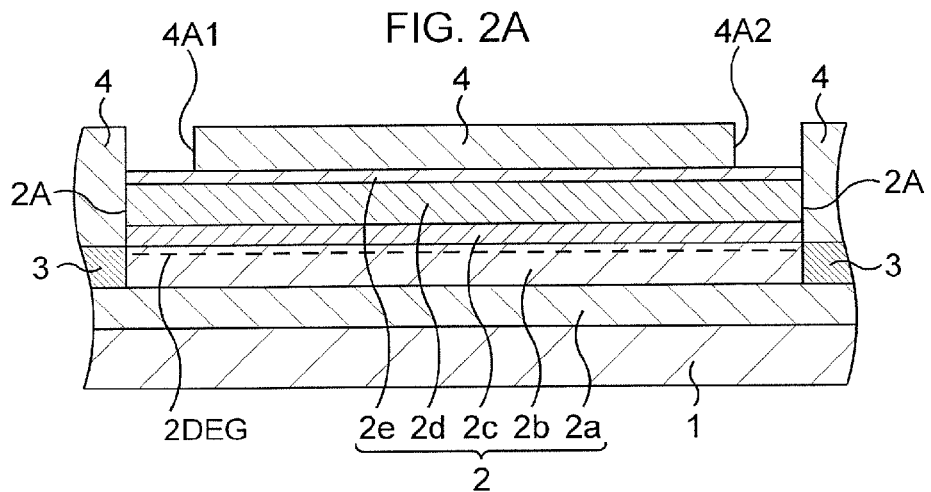
FIG. 2A to FIG. 2C, which are continued from FIG. 1A to FIG. 1C, are schematic cross-sectional views illustrating the method of manufacturing the AlGaN/GaN HEMT according to the first embodiment in order of steps.

Subsequently, as illustrated in FIG. 2A, electrode recesses 4A1, 4A2 for a source electrode and a drain electrode are formed in the protective insulating film 4.

In more detail, a resist is first applied on a surface of the protective insulating film 4. The resist is processed by lithography, whereby openings from which a portion corresponding to a region where to form the source electrode and a portion corresponding to a region where to form the drain electrode, in the surface of the protective insulating film 4 are exposed are formed in the resist. Consequently, a resist mask having the openings is formed.

By using this resist mask, the planned electrode formation regions of the protective insulating film 4 are dry-etched to be removed until a surface of the cap layer 2e is exposed. Consequently, the electrode recess 4A1 from which the region where to form the source electrode in the surface of the cap layer 2e is exposed and the electrode recess 4A2 from which the region where to form the drain electrode in the surface of the cap layer 2e is exposed are formed in the protective insulating film 4. For the dry etching, fluorine-based etching gas such as $SF_6$ is used, for instance. This dry etching is required to give as little etching damage as possible to the cap layer 2e, and the dry etching using the fluorine-based gas gives only a small damage to the cap layer 2e.

The resist mask is removed by ashing using oxygen plasma or by wetting using a predetermined chemical solution.

Figure 2B:
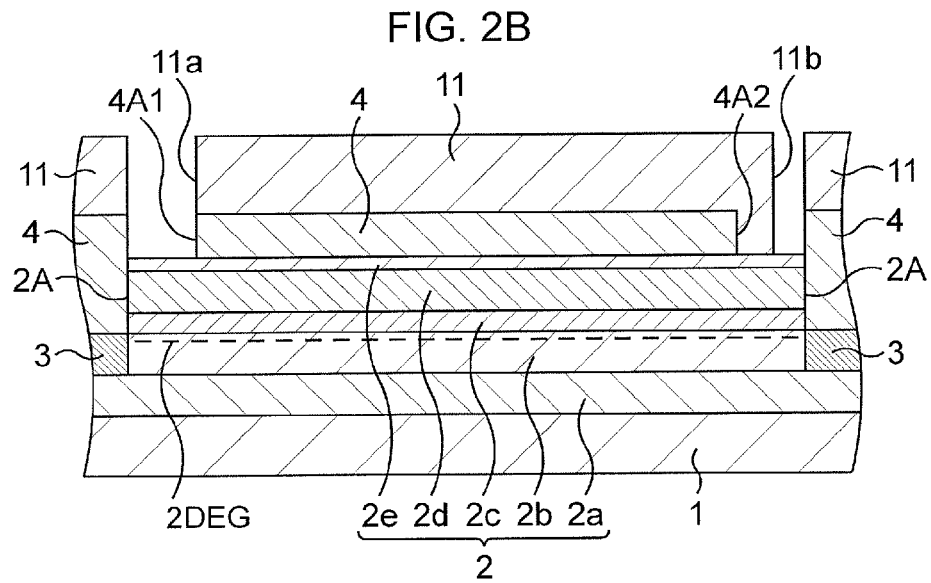

Subsequently, as illustrated in FIG. 2B, a resist mask 11 is formed.

In more detail, a resist is applied on the whole surface. The resist is processed by lithography, whereby an opening 11a from which the electrode recess 4A1 for the source electrode in the surface of the cap layer 2e and an opening 11b from which part of the electrode recess 4A2 for the drain electrode in the surface of the cap layer 2e are exposed are formed in the resist. Consequently, the resist mask 11 having the openings 11a, 11b is formed.

Figure 2C:
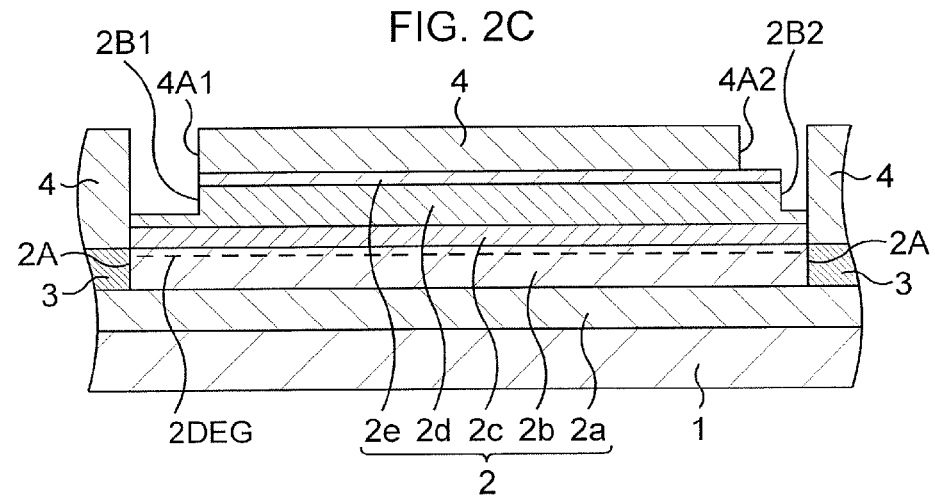

Subsequently, as illustrated in FIG. 2C, electrode recesses 2B1, 2B2 are formed in the compound semiconductor stacked structure 2.

By using the resist mask 11, the cap layer 2e and upper layer portions of the electron supply layer 2d are dry-etched to be removed so that lower layer portions of the electron supply layer 2d are left. Consequently, in the compound semiconductor stacked structure 2, the electrode recess 2B1 from which the region where to form the source electrode in the lower layer portion of the electron supply layer 2d is exposed and the electrode recess 2B2 from which the region where to form the drain electrode in the lower layer portion of the electron supply layer 2d is exposed are formed. For the dry-etching, chlorine-based etching gas such as $Cl_2$ is used, for instance.

The resist mask 11 is removed by ashing using oxygen plasma or by wetting using a predetermined chemical solution.

Figure 3A:
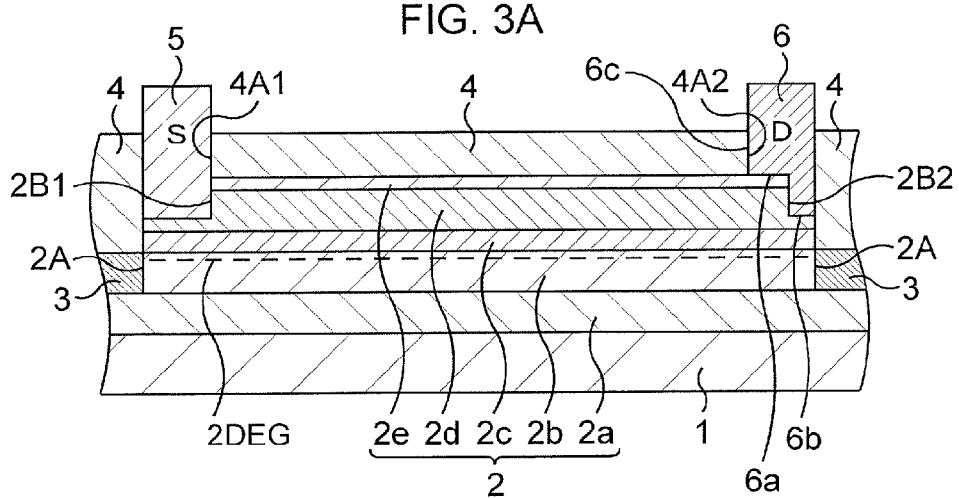
FIG. 3A to FIG. 3C, which are continued from FIG. 2A to FIG. 2C, are schematic cross-sectional views illustrating the method of manufacturing the AlGaN/GaN HEMT according to the first embodiment in order of steps.

Subsequently, as illustrated in FIG. 3A, the source electrode 5 and the drain electrode 6 are formed.

In more detail, a resist is applied on the surface of the protective insulating film 4. The resist is processed by lithography, whereby openings from which the electrode recesses 4A1, 2B1 for the source electrode and the electrode recesses 4A2, 2B2 for the drain electrode are exposed are formed in the resist. Consequently, a resist mask having the openings is formed.

By using this resist mask, for example, Ti/Al as an electrode material is deposited on the resist mask including the inside of the openings from which the electrode recesses 4A1, 2B1 and the electrode recesses 4A2, 2B2 are exposed, by a vapor deposition method, for instance. A thickness of Ti is about 30 nm and a thickness of Al is about 200 nm. By a lift-off method, the resist mask and Ti/Al deposited thereon are removed. Thereafter, the Si substrate 1 is heat-treated in, for example, a nitrogen atmosphere at a temperature of about 400° C. to about 1000° C., for example, about 600° C., and the residual Ti/Al is brought into ohmic contact with the compound semiconductor stacked structure 2. The heat treatment is sometimes unnecessary, provided that the ohmic contact between Ti/Al and the electron supply layer 2d is obtained. Consequently, the source electrode 5 part of whose electrode material fills the electrode recesses 4A1, 2B1 and the drain electrode 6 part of whose electrode material fills the electrode recesses 4A2, 2B2 are formed.

The source electrode 5 and the drain electrode 6 are in contact with the electron supply layer 2d and the cap layer 2e and not in contact with the electron transit layer 2b (intermediate layer 2c).

The drain electrode 6 has a stepped structure on its lower surface and has a plurality of bottom surfaces, here two bottom surfaces 6a, 6b along a transit direction of 2DEG, out of contact surfaces with the compound semiconductor stacked structure 2. The plural bottom surfaces are located at different distances from 2DEG, with the bottom surface closer to the source electrode 5 being more apart from 2DEG. In this embodiment, the bottom surface 6a is more apart from 2DEG than the bottom surface 6b.

In order to obtain the stepped-structure, in this embodiment, the two-stage stepped structure, of the lower surface, the drain electrode 6 fills also the inside of the electrode recess 4A2 of the protective insulating film 4, and a contact side surface 6c close to the source electrode 5 out of contact side surfaces with the protective insulating film 4 is coupled to the bottom surface 6a.

Incidentally, the source electrode may also have a stepped structure on its lower surface similarly to the drain electrode 6.

Figure 3B:
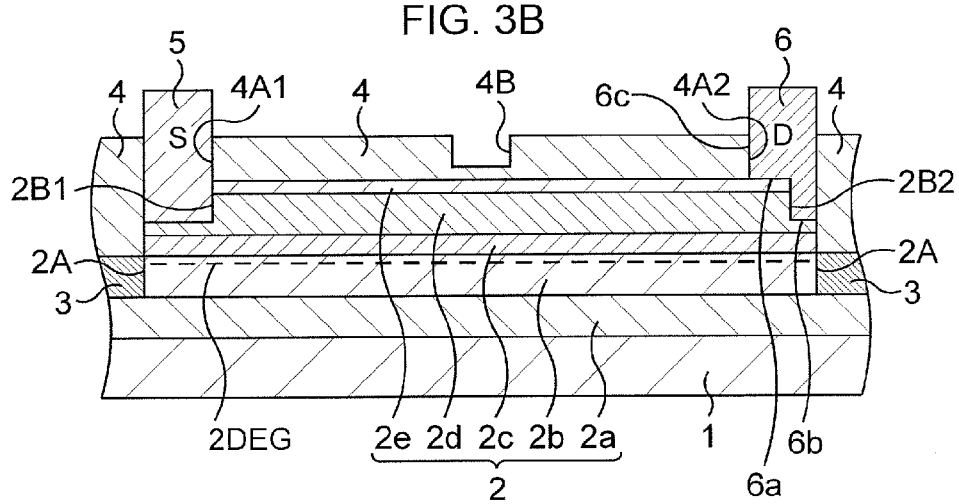

Subsequently, an electrode recess 4B for a gate electrode is formed in the protective insulating film 4 as illustrated in FIG. 3B.

In more detail, a resist is first applied on the surface of the compound semiconductor stacked structure 2. The resist is processed by lithography, whereby an opening from which a portion corresponding to a position where to form the gate electrode (planned electrode formation position), in the surface of the protective insulating film 4 is exposed is formed in the resist. Consequently, a resist mask having the opening is formed.

By using this resist mask, an about 40 nm upper portion of the protective insulating film 4 is dry-etched to be removed so that an about 20 nm lower portion of the protective insulating film 4 at the planned electrode formation position is left. Consequently, the electrode recess 4B for the gate electrode is formed in the protective insulating film 4.

The resist mask is removed by ashing using oxygen plasma or by wetting using a predetermined chemical solution.

In this embodiment, in the protective insulating film 4, the portion with an about 20 nm thickness left on a bottom portion of the electrode recess 4B functions as a gate insulating film.

Incidentally, the electrode recess for the gate electrode may be formed as a through trench from which the surface of the compound semiconductor stacked structure 2 is exposed, and the gate insulating film may be separately formed on the protective insulating film 4 so as to cover the surface. In this case, $Al_2O_3$ with an about 2 nm to about 200 nm film thickness, for example, an about 10 nm film thickness is deposited by, for example, an ALD method (Atomic Layer Deposition), thereby forming the gate insulating film. For the deposition of $Al_2O_3$, a plasma CVD method, a sputtering method, or the like may be used, for instance, instead of the ALD method. Further, a nitride or an oxynitride of Al may be used instead of depositing $Al_2O_3$. Besides, for the formation of the gate insulating film, an oxide, a nitride, or an oxynitride of Si, Hf, Zr, Ti, Ta, and W may be deposited or some appropriately selected from these may be deposited in multilayer.

Figure 3C:
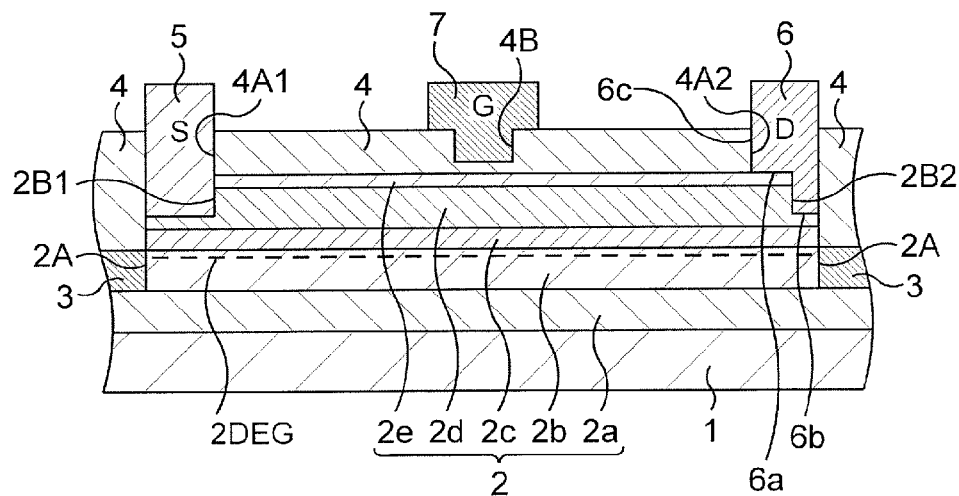

Subsequently, the gate electrode 7 is formed as illustrated in FIG. 3C.

In more detail, a resist mask for forming the gate electrode is first formed. Here, an eaves-structure two-layer resist suitable for a vapor deposition method and a liftoff method is used, for instance. This resist is applied on the protective insulating film 4, and an opening from which the portion corresponding to the electrode recess 4B, in the protective insulating film 4 is exposed is formed. Consequently, the resist mask having the opening is formed.

By using this resist mask, Ni/Au, for example, is deposited as an electrode material on the resist mask including the inside of the opening from which the portion corresponding to the electrode recess 4B, in the protective insulating film 4 is exposed, by, for example, the vapor deposition method. A thickness of Ni is about 30 nm and a thickness of Au is about 400 nm. The resist mask and Ni/Au deposited thereon are removed by the liftoff method. Consequently, the gate electrode 7 whose electrode material in its lower portion fills the inside of the electrode recess 4B and whose upper portion rides on the protective insulating film 4 is formed so that its cross section along a gate length is in a so-called overhanging shape. In the gate electrode 7, the gate length is, for example, about 0.5 μm and a gate width is, for example, about 400 μm.

Thereafter, through various processes such as the formation of an interlayer insulating film, the formation of wirings connected to the source electrode 5, the drain electrode 6, and the gate electrode 7, the formation of an upper protective film, and the formation of connection electrodes exposed to the uppermost surface, the AlGaN/GaN HEMT according to this embodiment is formed.

Figure 4:
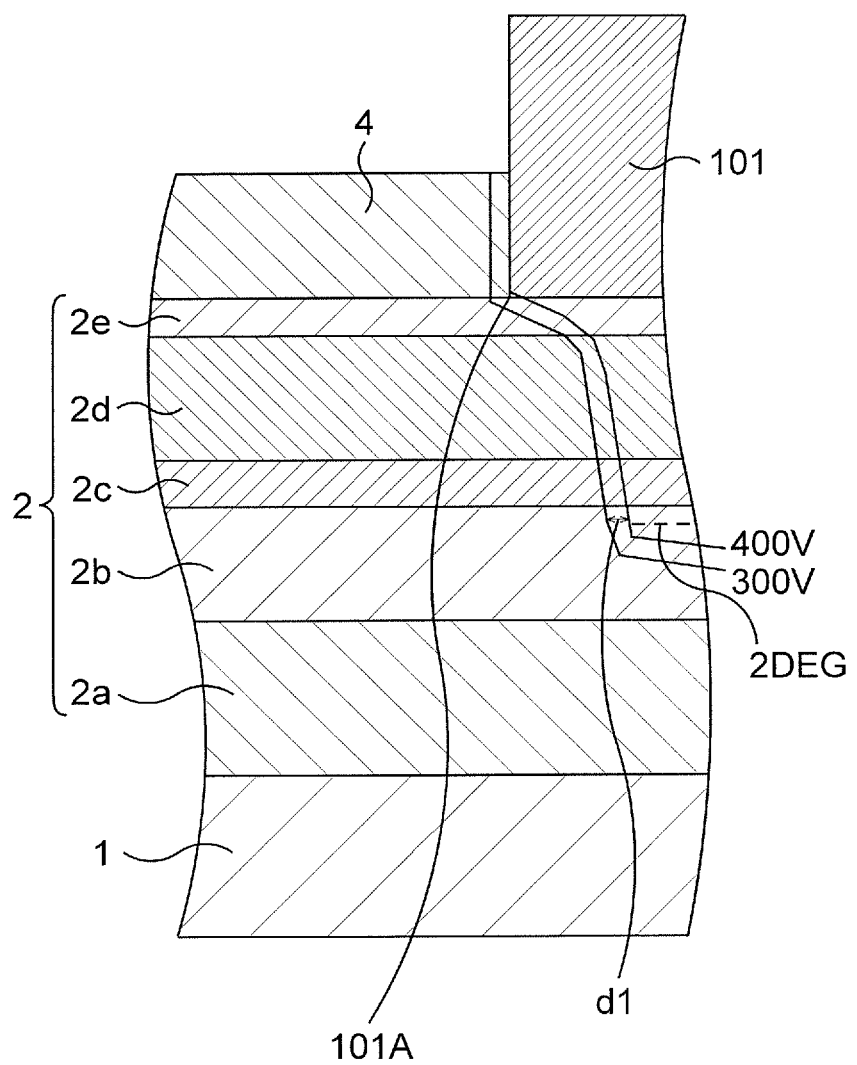
FIG. 4 is a characteristic view illustrating a result when a potential state of a drain electrode at the time of the application of a high operating voltage (gate-drain voltage) is studied by simulation, regarding an AlGaN/GaN HEMT according to a comparative example 1.

Regarding the AlGaN/GaN HEMT according to this embodiment, a potential state of the drain electrode at the time of the application of a high operating voltage (gate-drain voltage) was studied by simulation based on comparison with comparative examples. The results are presented in FIG. 4 to FIG. 6. FIG. 4 corresponds to a comparative example 1, FIG. 5 corresponds to a comparative example 2, and FIG. 6 corresponds to FIG. 3C of this embodiment, and each of them is a schematic cross-sectional view, with the drain electrode and its vicinity being enlarged. Concretely, isoelectric lines of 400 V and 300 V are illustrated, with the operating voltage being set to 400 V.

As illustrated in FIG. 4, an AlGaN/GaN HEMT of the comparative example 1 has a Si substrate 1, a compound semiconductor stacked structure 2, a protective insulating film 4, and so on similarly to this embodiment and a drain electrode 101 (and a source electrode) is formed so as to fill an electrode recess formed in the protective insulating film 4. The drain electrode 101 does not have a stepped structure on its lower surface and is in ohmic contact with a surface of a cap layer 2e.

In the comparative example 1, an interval d1 between the isoelectric line of 400 V and the isoelectric line of 300 V in a portion of 2DEG is very narrow. This means that electric field concentration is occurring on an electrode end 101A of the drain electrode 101. This electric field concentration causes the simultaneous generation of electrons and holes due to an avalanche effect, and the electrons and the holes further continuously cause the cumulative generation of electrons and holes to rapidly increase a current, so that a breakdown occurs in the drain electrode 101.

Figure 5:
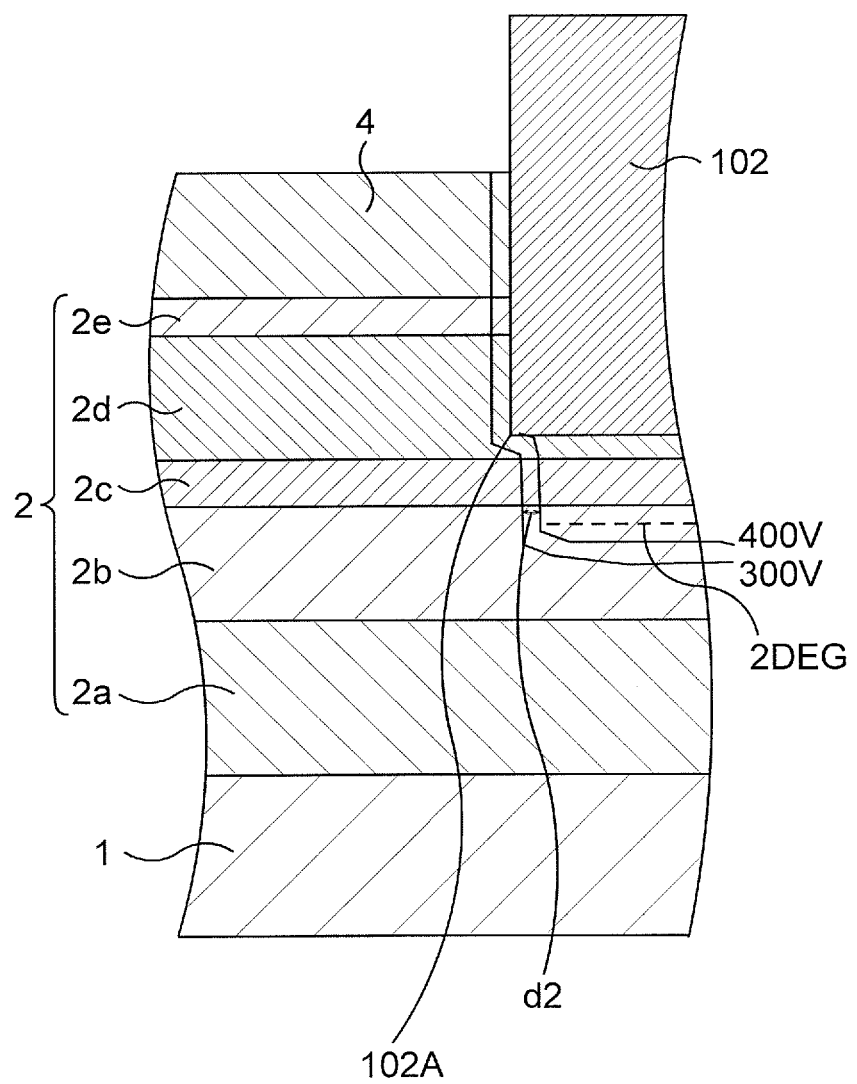
FIG. 5 is a characteristic view illustrating a result when a potential state of a drain electrode at the time of the application of a high operating voltage (gate-drain voltage) is studied by simulation, regarding an AlGaN/GaN HEMT according to a comparative example 2.

As illustrated in FIG. 5, an AlGaN/GaN HEMT of the comparative example 2 has a Si substrate 1, a compound semiconductor stacked structure 2, a protective insulating film 4, and so on similarly to this embodiment and a drain electrode 102 (and a source electrode) is formed so as to fill an electrode recess formed in the protective insulating film 4, a cap layer 2e, and an electron supply layer 2d. The drain electrode 102 does not have a stepped structure on its lower surface and is in ohmic contact with the electron supply layer 2d.

In the comparative example 2, an interval d2 between the isoelectric line of 400 V and the isoelectric line of 300 V in a portion of 2DEG is also very narrow as in the comparative example 1. This means that electric field concentration is occurring on an electrode end 102A of the drain electrode 102. This electric field concentration causes the simultaneous generation of electrons and holes due to an avalanche effect, and the electrons and the holes further continuously cause the cumulative generation of electrons and holes to rapidly increase a current, so that a breakdown occurs in the drain electrode 102.

Figure 6:
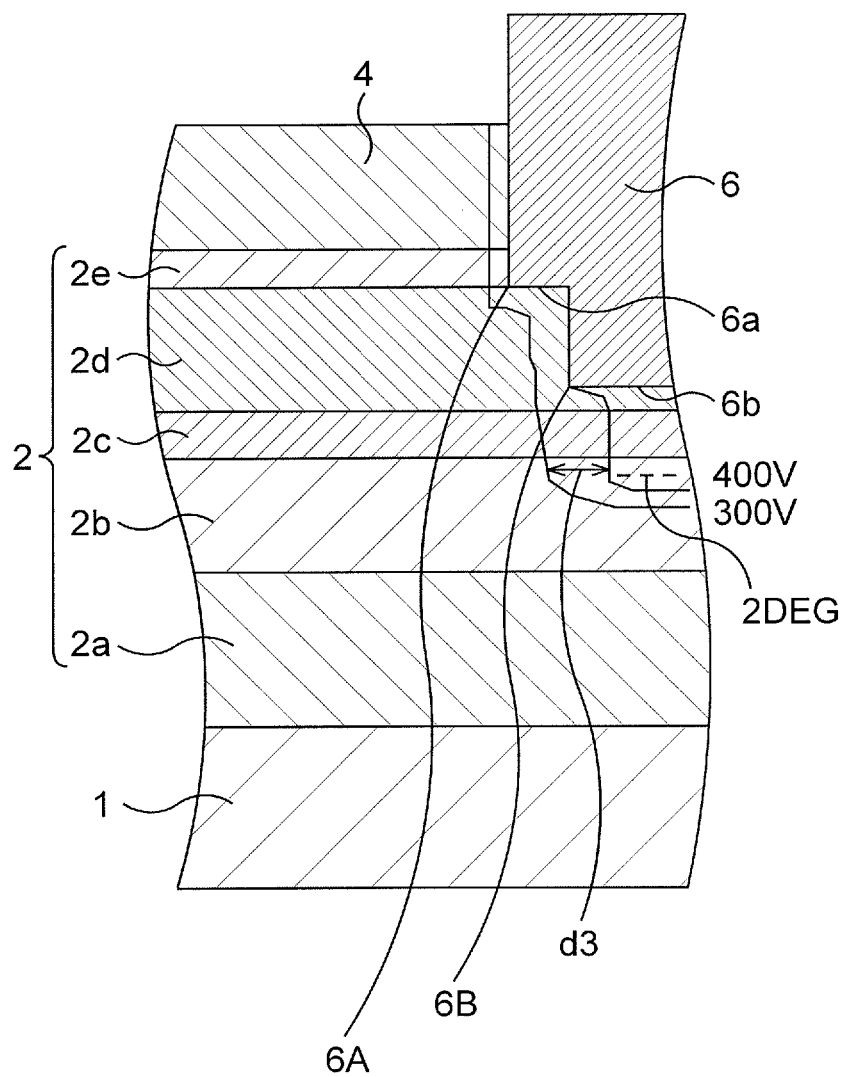
FIG. 6 is a characteristic view illustrating a result when a potential state of a drain electrode at the time of the application of a high operating voltage (gate-drain voltage) is studied by simulation, regarding the AlGaN/GaN HEMT according to the first embodiment.

In this embodiment, an interval d3 between the isoelectric line of 400 V and the isoelectric line of 300 V in a portion of DEG is far wider than the intervals d1, d2 as illustrated in FIG. 6. The drain electrode 6 in this embodiment has the two-stage stepped structure on its lower surface, and the bottom surface 6a is more apart from 2DEG than the bottom surface 6b. With this structure, the electric field concentration occurs on two electrode ends 6A, 6B of the drain electrode 6. Since the electric field concentration is decided by a degree of depletion of 2DEG, the electric field concentration is distributed to the two electrode ends 6A, 6B to be alleviated. Consequently, the avalanche effect is inhibited and the breakdown of the drain electrode 6 is prevented.

As described above, according to this embodiment, a highly reliable AlGaN/GaN HEMT that prevents an avalanche effect which is the simultaneous generation of holes and electrons, to inhibit snap-back and realizes a stable high withstand voltage to enable performance improvement and yield improvement is realized.

Second Embodiment

In this embodiment, a structure and a manufacturing method of an AlGaN/GaN HEMT are disclosed as in the first embodiment, but a stepped structure of a drain electrode is different from that of the first embodiment. Note that the same constituent members and so on as those of the first embodiment will be denoted by the same reference signs and a detailed description thereof will be omitted.

FIG. 7A to FIG. 7C and FIG. 10A to FIG. 100 are schematic cross-sectional views illustrating main steps of the method of manufacturing the AlGaN/GaN HEMT according to the second embodiment.

In this embodiment, the steps in FIG. 1A to FIG. 2A are first performed as in the first embodiment. At this time, electrode recesses 4A1, 4A2 for a source electrode and a drain electrode are formed in a protective insulating film 4. A state at this time is illustrated in FIG. 7A.

Subsequently, as illustrated in FIG. 7B, a resist mask 21 is formed.

In more detail, a resist is applied on the whole surface. The resist is processed by lithography, whereby an opening 21a from which the electrode recess 4A1 for the source electrode in a surface of a cap layer 2e and an opening 21b from which part of the electrode recess 4A2 for the drain electrode in the surface of the cap layer 2e is exposed are formed in the resist. Consequently, the resist mask 21 having the openings 21a, 21b is formed.

Subsequently, as illustrated in FIG. 7C, electrode recesses 2C1, 2C2 are formed in a compound semiconductor stacked structure 2.

By using the resist mask 21, the cap layer 2e and upper layer portions of an electron supply layer 2d are dry-etched to be removed so that lower layer portions of the electron supply layer 2d are left. Consequently, in the compound semiconductor stacked structure 2, the electrode recess 2C1 from which a region where to form the source electrode in the lower layer portion of the electron supply layer 2d is exposed and the electrode recess 2C2 from which a region where to form the drain electrode in the lower layer portion of the electron supply layer 2d is exposed are formed. For the dry-etching, chlorine-based etching gas such as $Cl_2$, for example, is used.

The resist mask 21 is removed by ashing using oxygen plasma or by wetting using a predetermined chemical solution.

Figure 8A:
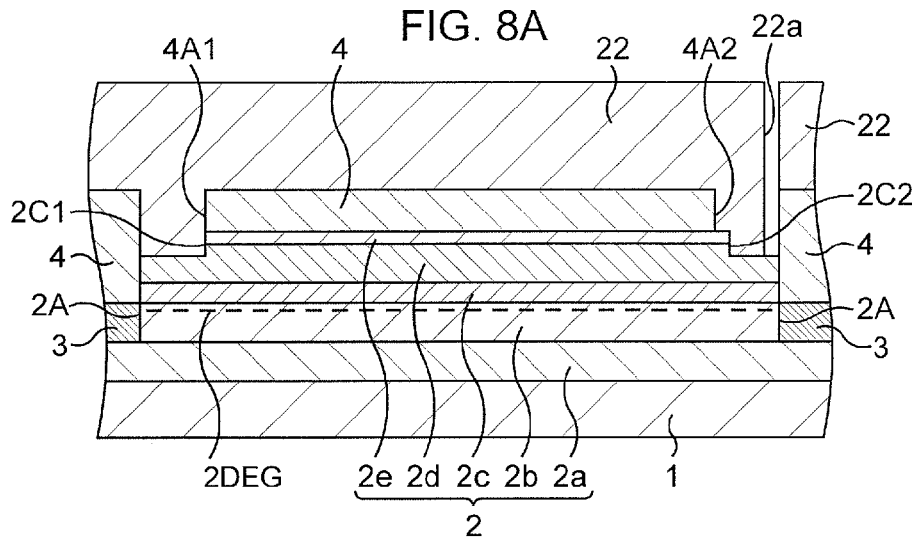
FIG. 8A to FIG. 8C, which are continued from FIG. 7A to FIG. 7C, are schematic cross-sectional views illustrating main steps of the method of manufacturing the AlGaN/GaN HEMT according to the second embodiment.
Figure 8B:
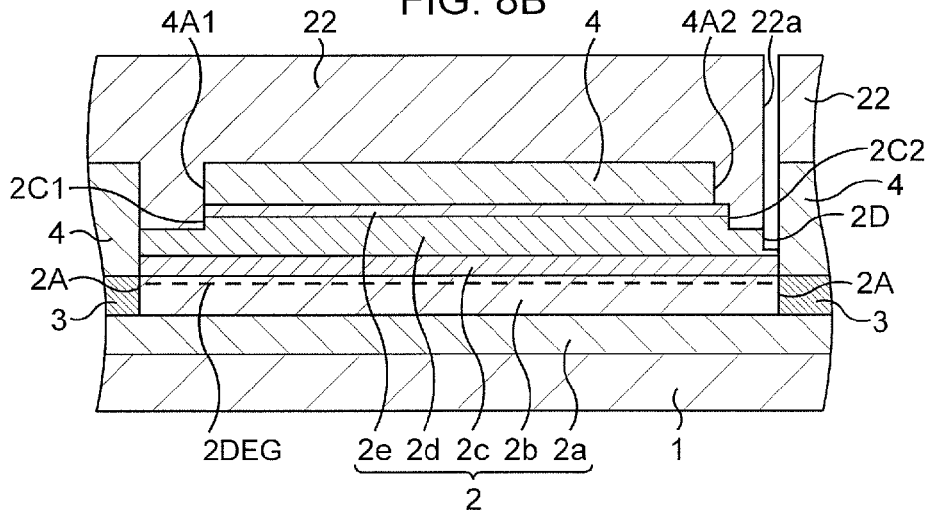

Subsequently, as illustrated in FIG. 8A, a resist mask 22 is formed.

In more detail, a resist is applied on the whole surface. The resist is processed by lithography, whereby an opening 22a from which part of the electrode recess 4B2 for the drain electrode in the surface of the cap layer 2e is exposed is formed in the resist. Consequently, the resist mask 22 having the opening 22a is formed.

Subsequently, as illustrated in FIG. 88, an electrode recess 2D is formed in the compound semiconductor stacked structure 2.

By using the resist mask 22, an upper layer portion of the electron supply layer 2d is dry-etched to be removed so that the lower layer portion of the electron supply layer 2d is left. Consequently, in the compound semiconductor stacked structure 2, the electrode recess 2D from which a region where to form the drain electrode in the lower layer portion of the electron supply layer 2d is exposed is formed. For the dry-etching, chlorine-based etching gas such as $Cl_2$, for example, is used.

Figure 8C:
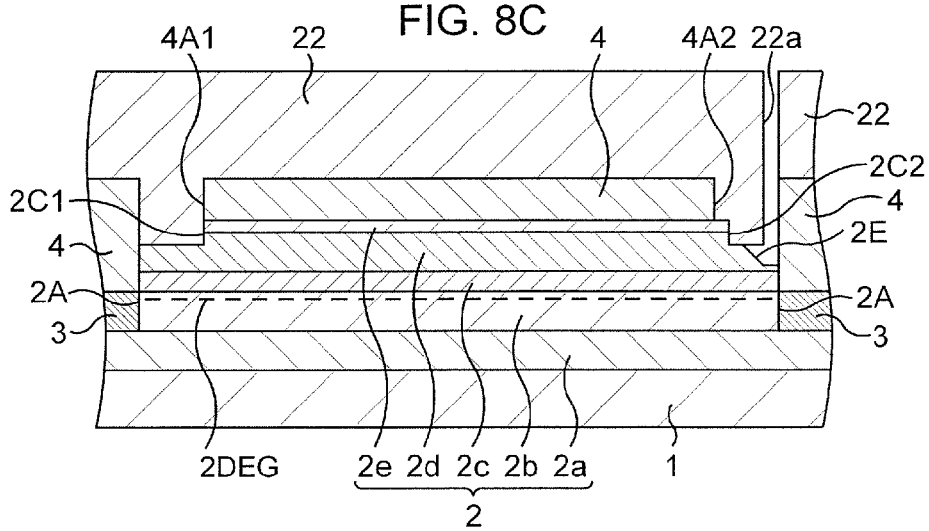

Subsequently, as illustrated in FIG. 8C, an electrode recess 2E is formed in the compound semiconductor stacked structure 2.

By using the resist mask 22 again, the electrode recess 2D of the electron supply layer 2d is wet-etched. A side surface of the electrode recess 2D becomes in a forward tapered shape with a predetermined angle (for example, about 45°), and the electrode recess 2E is formed. As a chemical solution for the wet etching, sulfuric acid/hydrogen peroxide is used. Alternatively, by using NMDW (manufactured by Tokyo Ohka Kogyo Co., Ltd.) or the like being an alkaline developing solution, the side surface in the forward tapered shape is similarly formed in the electrode supply layer 2d.

Figure 9A:
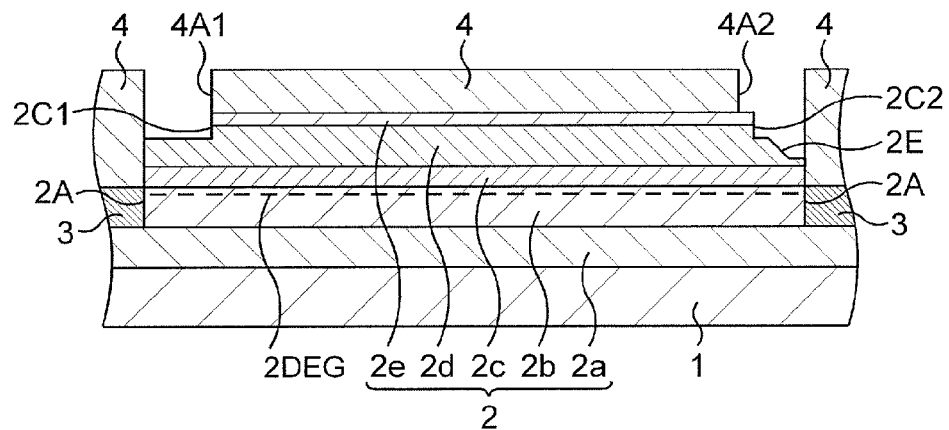
FIG. 9A and FIG. 9B, which are continued from FIG. 8A to FIG. 8C, are schematic cross-sectional views illustrating main steps of the method of manufacturing the AlGaN/GaN HEMT according to the second embodiment.

Subsequently, the resist mask 22 is removed as illustrated in FIG. 9A.

The resist mask 22 is removed by ashing using oxygen plasma or by wet etching using a predetermined chemical solution.

Consequently, the electrode recess 2C1 from which the region where to form the source electrode in the lower layer portion of the electron supply layer 2d is exposed and the electrode recesses 2C2, 2E from which the region where to form the drain electrode in the lower layer portion of the electron supply layer 2d is exposed are formed in the compound semiconductor stacked structure 2.

Figure 9B:
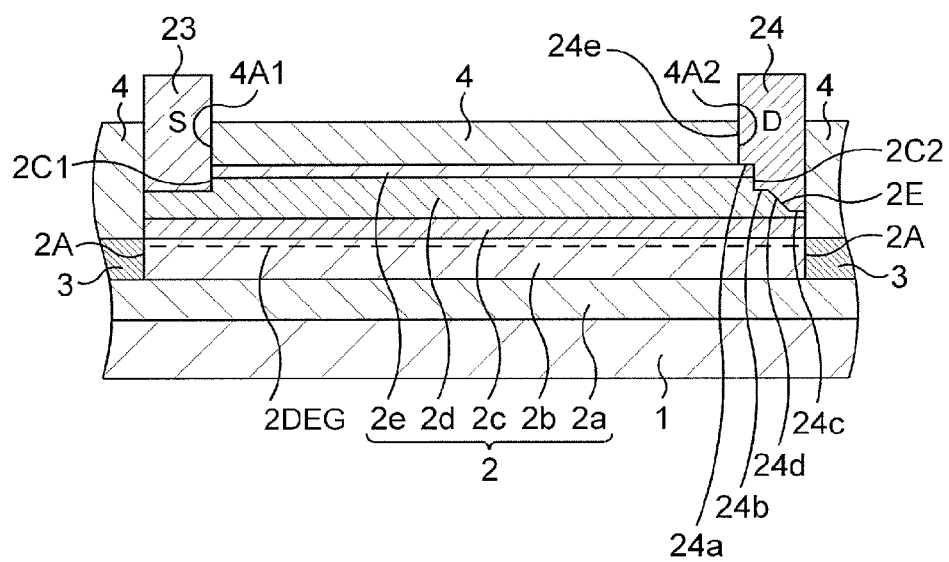

Subsequently, the source electrode 23 and the drain electrode 24 are formed as illustrated in FIG. 9B.

In more detail, a resist is applied on a surface of the protective insulating film 4. The resist is processed by lithography, whereby openings from which the electrode recesses 4A1, 2C1 for the source electrode and the electrode recesses 4A2, 2C2, 2E for the drain electrode are exposed are formed in the resist. Consequently, a resist mask having the openings is formed.

By using this resist mask, for example, Ti/Al is deposited as an electrode material on the resist mask including the inside of the openings from which the electrode recesses 4A1, 2C1 and the electrode recesses 4A2, 2C2, 2E are exposed, by a vapor deposition method, for instance. A thickness of Ti is about 30 nm and a thickness of Al is about 200 nm. The resist mask and Ti/Al deposited thereon are removed by a liftoff method. Thereafter, the Si substrate 1 is heat-treated in, for example, a nitrogen atmosphere at a temperature of about 400° C. to about 1000° C., for example, about 600° C., and the residual Ti/Al is brought into ohmic contact with the compound semiconductor stacked structure 2. The heat treatment is sometimes unnecessary, provided that the ohmic contact between Ti/Al and the electron supply layer 2d is obtained. Consequently, the source electrode 23 part of whose electrode material fills the electrode recesses 4A1, 2C1 and the drain electrode 24 part of whose electrode material fills the electrode recesses 4A2, 2C2, 2E are formed.

The source electrode 23 and the drain electrode 24 are in contact with the electron supply layer 4d and the cap layer 4e and not in contact with the electron transit layer 4b (intermediate layer 4c).

The drain electrode 24 has a stepped structure on its lower surface and has a plurality of bottom surfaces, here three bottom surfaces 24a, 24b, 24c along a transit direction of 2DEG, out of contact surfaces with the compound semiconductor stacked structure 2. The plural bottom surfaces are located at different distances from 2DEG, with the bottom surface closer to the source electrode 23 being more apart from 2DEG. In this embodiment, the bottom surface 24a is more apart from 2DEG than the bottom surface 24b, and the bottom surface 24b is more apart from 2DEG than the bottom surface 24c.

In the drain electrode 24, a side surface 24d coupling the bottom surfaces 24b, 24c out of the contact surfaces with the compound semiconductor stacked structure 2 is in a tapered shape so that its portion more apart from the source electrode 23 comes closer to 2DEG.

In order to obtain the stepped-structure, in this embodiment, the three-stage stepped structure, of the lower surface, the drain electrode 24 fills also the inside of the electrode recess 4A2 of the protective insulating film 4, and the contact side surface 24e close to the source electrode 23 out of contact side surfaces with the protective insulating film 4 is coupled to the bottom surface 24a.

Incidentally, the source electrode may also have the stepped structure on its lower surface similarly to the drain electrode 24.

Figure 10A:
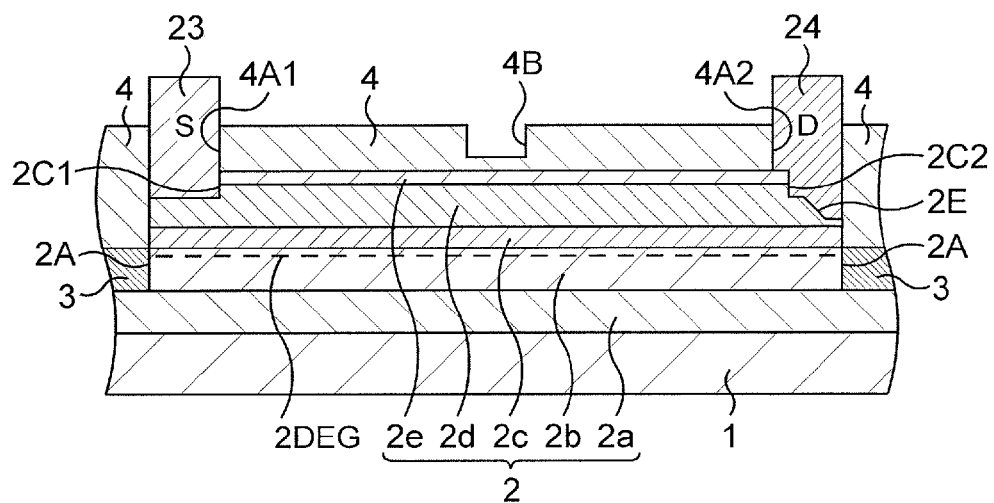
FIG. 10A to FIG. 10B, which are continued from FIG. 9A and FIG. 9B, are schematic cross-sectional views illustrating main steps of the method of manufacturing the AlGaN/GaN HEMT according to the second embodiment.

Subsequently, an electrode recess 4B for a gate electrode is formed in the protective insulating film 4 as illustrated in FIG. 10A.

In more detail, a resist is first applied on a surface of the compound semiconductor stacked structure 2. The resist is processed by lithography, whereby an opening from which a portion corresponding to a position where to form the gate electrode (planned electrode formation position), in the surface of the protective insulating film 4 is exposed is formed in the resist. Consequently, a resist mask having the opening is formed.

By using this resist mask, an about 40 nm upper portion of the protective insulating film 4 is dry-etched to be removed so that an about 20 nm lower portion of the protective insulating film 4 at the planned electrode formation position is left.

Consequently, the electrode recess 4B for the gate electrode is formed in the protective insulating film 4.

The resist mask is removed by asking using oxygen plasma or by wetting using a predetermined chemical solution.

In this embodiment, in the protective insulating film 4, the portion with an about 20 nm thickness left on a bottom portion of the electrode recess 4B functions as a gate insulating film.

Incidentally, the electrode recess for the gate electrode may be formed as a through trench from which the surface of the compound semiconductor stacked structure 2 is exposed, and the gate insulating film may be separately formed on the protective insulating film 4 so as to cover the surface. In this case, $Al_2O_3$ with an about 2 nm to about 200 nm film thickness, for example, an about 10 nm film thickness is deposited by, for example, an ALD method (Atomic Layer Deposition), thereby forming the gate insulating film. For the deposition of $Al_2O_3$, a plasma CVD method, a sputtering method, or the like may be used, for instance, instead of the ALD method. Further, instead of depositing $Al_2O_3$, a nitride or an oxynitride of Al may be used. Besides, for the formation of the gate insulating film, an oxide, a nitride, or an oxynitride of Si, Hf, Zr, Ti, Ta, and W may be deposited or some appropriately selected from these may be deposited in multilayer.

Figure 10B:
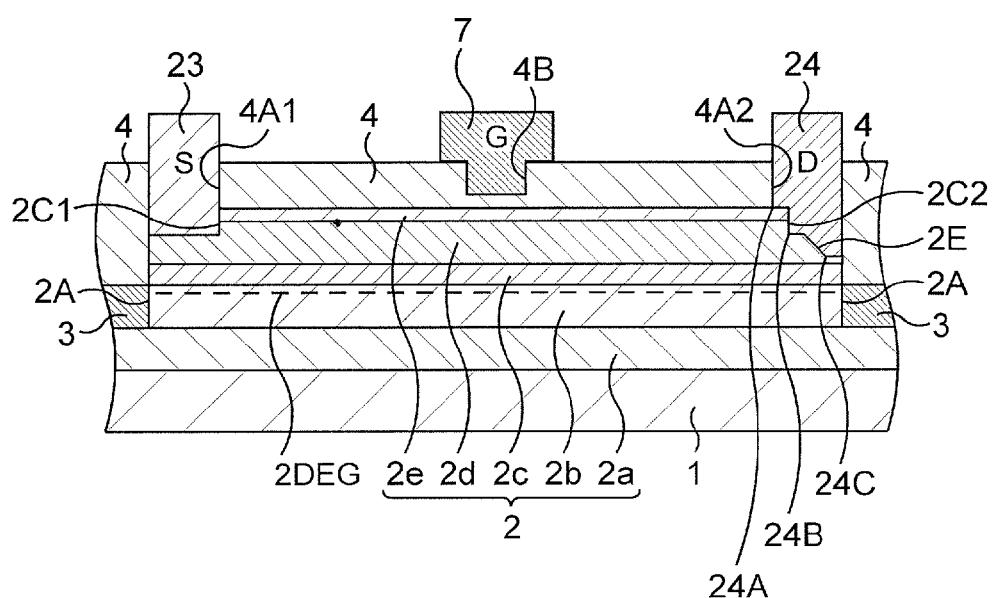

Subsequently, the gate electrode 7 is formed as illustrated in FIG. 10B.

In more detail, a resist mask for forming the gate electrode is first formed. Here, an eaves-structure two-layer resist suitable for a vapor deposition method and a liftoff method is used, for instance. This resist is applied on the protective insulating film 4, and an opening from which the portion corresponding to the electrode recess 4B, in the protective insulating film 4 is exposed is formed. Consequently, the resist mask having the opening is formed.

By using this resist mask, Ni/Au, for example, is deposited as an electrode material on the resist mask including the inside of the opening from which the portion corresponding to the electrode recess 4B, in the protective insulating film 4 is exposed, by, for example, the vapor deposition method. A thickness of Ni is about 30 nm and a thickness of Au is about 400 nm. The resist mask and Ni/Au deposited thereon are removed by the liftoff method. Consequently, the gate electrode 7 whose electrode material in its lower portion fills the inside of the electrode recess 4B and whose upper portion rides on the protective insulating film 4 is formed so that its cross section along a gate length is in a so-called overhanging shape. In the gate electrode 7, the gate length is, for example, about 0.5 µm and a gate width is, for example, about 400 µm.

Thereafter, through various processes such as the formation of an interlayer insulating film, the formation of wirings connected to the source electrode 23, the drain electrode 24, and the gate electrode 7, the formation of an upper protective film, and the formation of connection electrodes exposed to the uppermost surface, the AlGaN/GaN HEMT according to this embodiment is formed.

In this embodiment, the drain electrode 24 has the three-stage stepped structure on its lower surface, and the bottom surface 24a is more apart from 2DEG than the bottom surface 24b, and the bottom surface 24b is more apart from 2DEG than the bottom surface 24c. With this structure, the electric field concentration occurs on three electrode ends 24A, 24B, 24C of the drain electrode 24. Since the electric field concentration is decided by a degree of depletion of 2DEG, the electric field concentration is distributed to the three electrode ends 24A, 24B, 24C to be alleviated. Further, the side surface 24d is in the tapered shape so that its portion more apart from the gate electrode 7 becomes closer to 2DEG, which more alleviates the electric field concentration. Consequently, the avalanche effect is surely inhibited and the breakdown of the drain electrode 24 is prevented.

As described above, according to this embodiment, a highly reliable AlGaN/GaN HEMT that prevents an avalanche effect which is the simultaneous generation of holes and electrons, to inhibit snap-back and realizes a stable high withstand voltage to enable performance improvement and yield improvement is realized.

Third Embodiment

In this embodiment, a structure and a manufacturing method of an AlGaN/GaN HEMT are disclosed as in the second embodiment, but a gate electrode and its lower layer structure are different from those of the second embodiment. Note that the same constituent members and so on as those of the first and second embodiments will be denoted by the same reference signs and a detailed description thereof will be omitted.

FIG. 11A to FIG. 11C and FIG. 12A to FIG. 12C are schematic cross-sectional views illustrating main steps of the method of manufacturing the AlGaN/GaN HEMT according to the third embodiment.

Figure 11A:
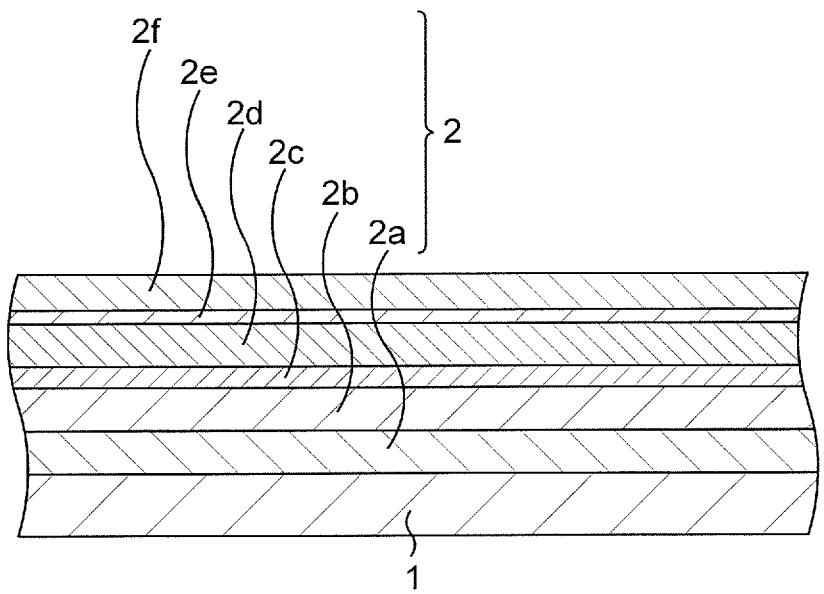
FIG. 11A to FIG. 11C are schematic cross-sectional views illustrating main steps of a method of manufacturing an AlGaN/GaN HEMT according to a third embodiment.

First, as illustrated in FIG. 11A, a compound semiconductor stacked structure 2 is formed on, for example, a Si substrate 1 as a growth substrate. As the growth substrate, a SiC substrate, a sapphire substrate, a GaAs substrate, a GaN substrate, or the like may be used instead of the Si substrate. Conductivity of the substrate may be either semi-insulating or conductive.

The compound semiconductor stacked structure 2 includes a buffer layer 2a, an electron transit layer 2b, an intermediate layer 2c, an electron supply layer 2d, a cap layer 2e, and a p-type semiconductor layer 2f.

In more detail, on the Si substrate 1, the following compound semiconductors are grown by, for example, a MOVPE method. A MBE method or the like may be used instead of the MOVPE method.

On the Si substrate 1, AlN with an about 100 nm thickness, i (intentionally undoped)-GaN with an about 1 µm thickness, i-AlGaN with an about 5 nm thickness, n-AlGaN with an about 30 nm thickness whose Al composition is, for instance, about 20%, n-GaN with an about 3 nm thickness, and p-GaN with a predetermined thickness are sequentially grown. Consequently, the buffer layer 2a, the electron transit layer 2b, the intermediate layer 2c, the electron supply layer 2d, the cap layer 2e, and the p-type semiconductor layer 2f are formed. As the buffer layer 2a, AlGaN may be used instead of AlN, or GaN may be grown by low-temperature growth.

As a growth condition of AlN, mixed gas of trimethylaluminum (TMA) gas and ammonia ($NH_3$) gas is used as source gas. As a growth condition of GaN, mixed gas of trimethylgallium (TMG) gas and $NH_3$ gas is used as source gas. As a growth condition of AlGaN, mixed gas of TMA gas, TMG gas, and $NH_3$ gas is used as source gas. Depending on the compound semiconductor layer that is to be grown, whether or not to supply the TMA gas being an Al source and the TMG gas being a Ga source and their flow rates are appropriately set. A flow rate of the $NH_3$ gas being a common source is set to about 100 ccm to about 10 LM. Further, growth pressure is set to about 50 Torr to about 300 Torr, and growth temperature is set to about 1000° C. to about 1200° C.

In order to grow n-AlGaN of the electron supply layer 2d and n-GaN of the cap layer 2e, for example, $SiH_4$ gas containing, for instance, Si is added as n-type impurities to the source gas at a predetermined flow rate, so that AlGaN and GaN are doped with Si. A doping concentration of Si is set to about $1\times10^{18}/cm^3$ to about $1\times10^{20}/cm^3$, for example, set to about $5\times10^{18}/cm^3$.

In order to grown p-GaN of the p-type semiconductor layer 2f, Cp$_2$Mg gas containing, for example, Mg as p-type impurities is added to the source gas at a predetermined flow rate, so that GaN is doped with Mg to a predetermined doping concentration.

Figure 11B:
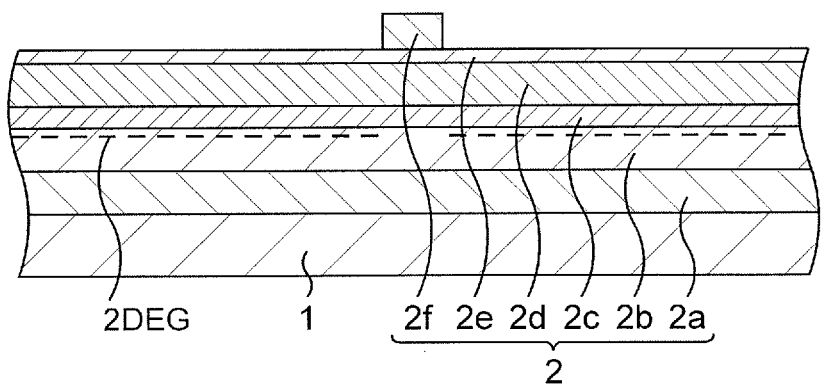

Subsequently, the p-type semiconductor layer 2f is processed as illustrated in FIG. 11B.

In more detail, a resist is applied on the p-type semiconductor layer 2f. The resist is processed by lithography, whereby a resist mask opening a region where to form a gate electrode is formed.

By using this resist mask, the p-type semiconductor layer 2f is dry-etched until a surface of the cap layer 2e is exposed. For the dry etching, chlorine-based etching gas such as Cl$_2$, for example, is used. Consequently, the p-type semiconductor layer 2f remains on the region where to form the gate electrode on the cap layer 2e.

The resist mask is removed by ashing using oxygen plasma or by wetting using a predetermined chemical solution.

Two-dimensional electron gas (2DEG) being transit electrons is generated in the vicinity of an interface of the electron transit layer 2b, with the electron supply layer 2d (to be exact, the intermediate layer 2c) except a region under and aligned with the p-type semiconductor layer 2f. This 2DEG is generated based on a difference in lattice constant between a compound semiconductor (here GaN) of the electron transit layer 2b and a compound semiconductor (here AlGaN) of the electron supply layer 2d. In this embodiment, due to the presence of the p-type semiconductor layer 2f, 2DEG disappears at the power-off time in the region under and aligned with the p-type semiconductor layer 2f. Consequently, a so-called normally-off operation is realized.

Subsequently, element isolation structures 3 are formed by the same step as that in FIG. 1B of the first embodiment, as in the second embodiment.

Figure 11C:
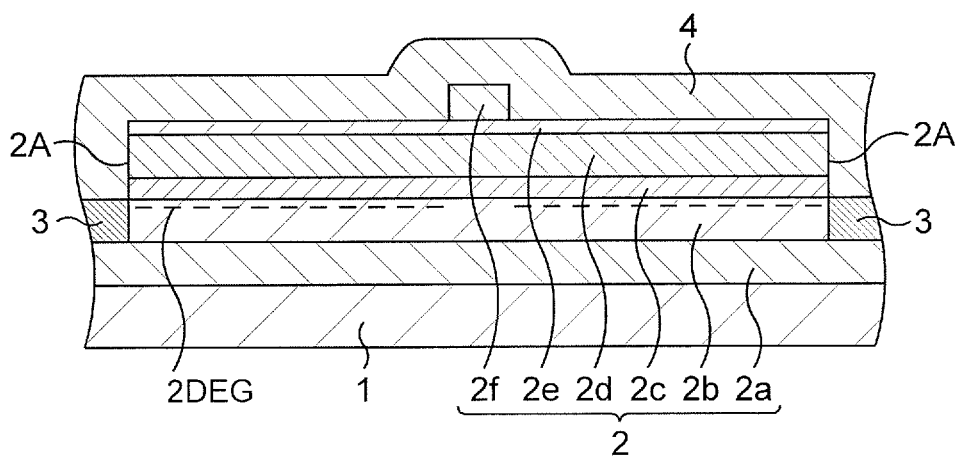

Subsequently, as illustrated in FIG. 11C, a protective insulating film 4 is formed.

In more detail, SiN with a thickness of about 30 nm to about 500 nm, for example, about 60 nm is deposited on the compound semiconductor stacked structure 2 by a plasma CVD method, a sputtering method, or the like so as to fill element isolation recesses 2A on the element isolation structures 3 and so as to cover the p-type semiconductor layer 2f. Consequently, the protective insulating film 4 is formed.

Subsequently, the same steps as those in FIG. 7A to FIG. 9B are executed as in the second embodiment. At this time, a source electrode 23 part of whose electrode material fills electrode recesses 4A1, 2C1 and a drain electrode 24 part of whose electrode material fills electrode recesses 4A2, 2C2, 2E are formed.

Figure 12A:
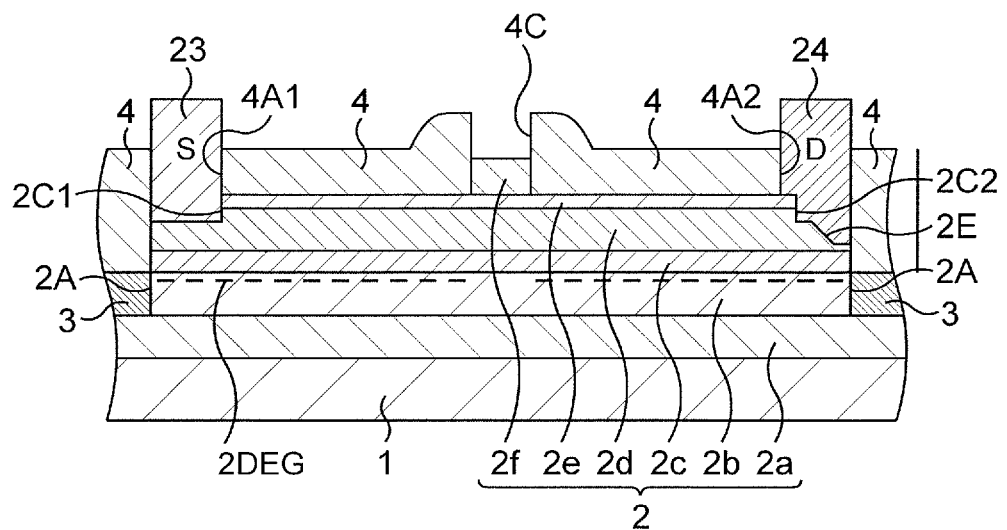
FIG. 12A and FIG. 12B, which are continued from FIG. 11A to FIG. 11C, are schematic cross-sectional views illustrating main steps of the method of manufacturing the AlGaN/GaN HEMT according to the third embodiment.

Subsequently, an electrode recess 4C for the gate electrode is formed in the protective insulating film 4 as illustrated in FIG. 12A.

In more detail, a resist is first applied on a surface of the protective insulating film 4. The resist is processed by lithography, whereby an opening from which a portion corresponding to the p-type semiconductor layer 2f, in the surface of the protective insulating film 4 is exposed is formed in the resist. Consequently, a resist mask having the opening is formed.

By using this resist mask, the protective insulating film 4 is dry-etched until a surface of the p-type semiconductor layer 2f is exposed. Consequently, the electrode recess 4C for the gate electrode is formed in the protective insulating film 4.

The resist mask is removed by ashing using oxygen plasma or by wetting using a predetermined chemical solution.

Figure 12B:
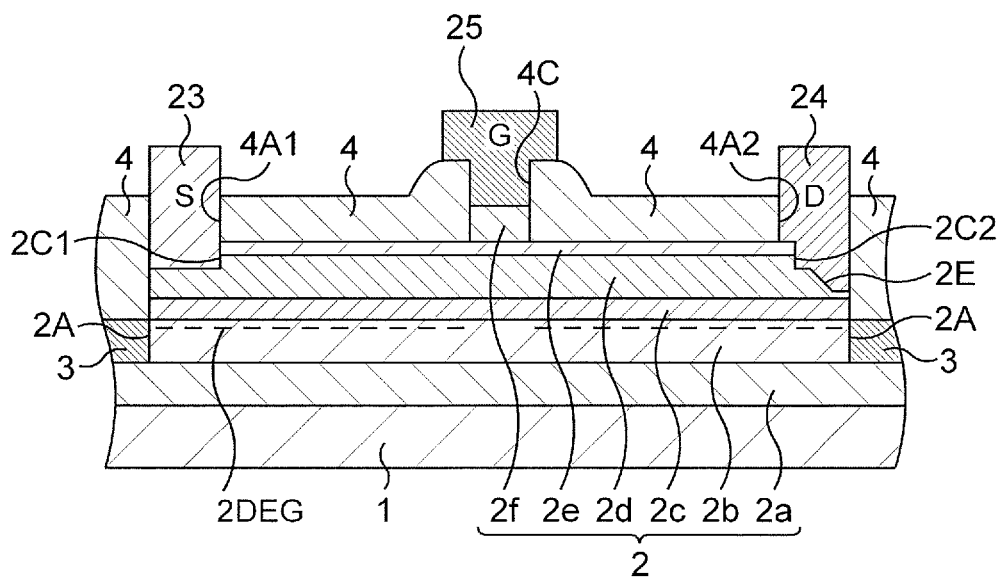

Subsequently, the gate electrode 25 is formed as illustrated in FIG. 12B.

In more detail, a resist mask for forming the gate electrode is first formed. Here, an eaves-structure two-layer resist suitable for a vapor deposition method and a liftoff method is used, for instance. This resist is applied on the protective insulating film 4, and an opening from which the portion corresponding to the electrode recess 4C, in the protective insulating film 4 is exposed is formed. Consequently, the resist mask having the opening is formed.

By using this resist mask, Ni/Au, for example, is deposited as an electrode material on the resist mask including the inside of the opening from which the portion corresponding to the electrode recess 4C, in the protective insulating film 4 is exposed, by, for example, the vapor deposition method. A thickness of Ni is about 30 nm and a thickness of Au is about 400 nm. The resist mask and Ni/Au deposited thereon are removed by the liftoff method. Consequently, the gate electrode 25 whose electrode material in its lower portion fills the inside of the electrode recess 4C to be in contact with the surface of the p-type semiconductor layer 2f and whose upper portion rides on the protective insulating film 4 is formed so that its cross section along a gate length is in a so-called overhanging shape. In the gate electrode 25, the gate length is, for example, about 0.5 μm and a gate width is, for example, about 400 μm.

Thereafter, through various processes such as the formation of an interlayer insulating film, the formation of wirings connected to the source electrode 23, the drain electrode 24, and the gate electrode 25, the formation of an upper protective film, and the formation of connection electrodes exposed to the uppermost surface, the AlGaN/GaN HEMT according to this embodiment is formed.

In this embodiment, the drain electrode 24 has the three-stage stepped structure on its lower surface, and the bottom surface 24a is more apart from 2DEG than the bottom surface 24b, and the bottom surface 24b is more apart from 2DEG than the bottom surface 24c. With this structure, the electric field concentration occurs on three electrode ends 24A, 24B, 24C of the drain electrode 24. Since the electric field concentration is decided by a degree of depletion of 2DEG, the electric field concentration is distributed to the three electrode ends 24A, 24B, 24C to be alleviated. Further, a side surface 24d is in a tapered shape so that its portion more apart from the gate electrode 25 becomes closer to 2DEG, which more alleviates the electric field concentration. Consequently, the avalanche effect is surely inhibited and the breakdown of the drain electrode 24 is prevented.

As described above, according to this embodiment, a highly reliable AlGaN/GaN HEMT that prevents an avalanche effect which is the simultaneous generation of holes and electrons, to inhibit snap-back and realizes a stable high withstand voltage to enable performance improvement and yield improvement is realized.

Figure 13:
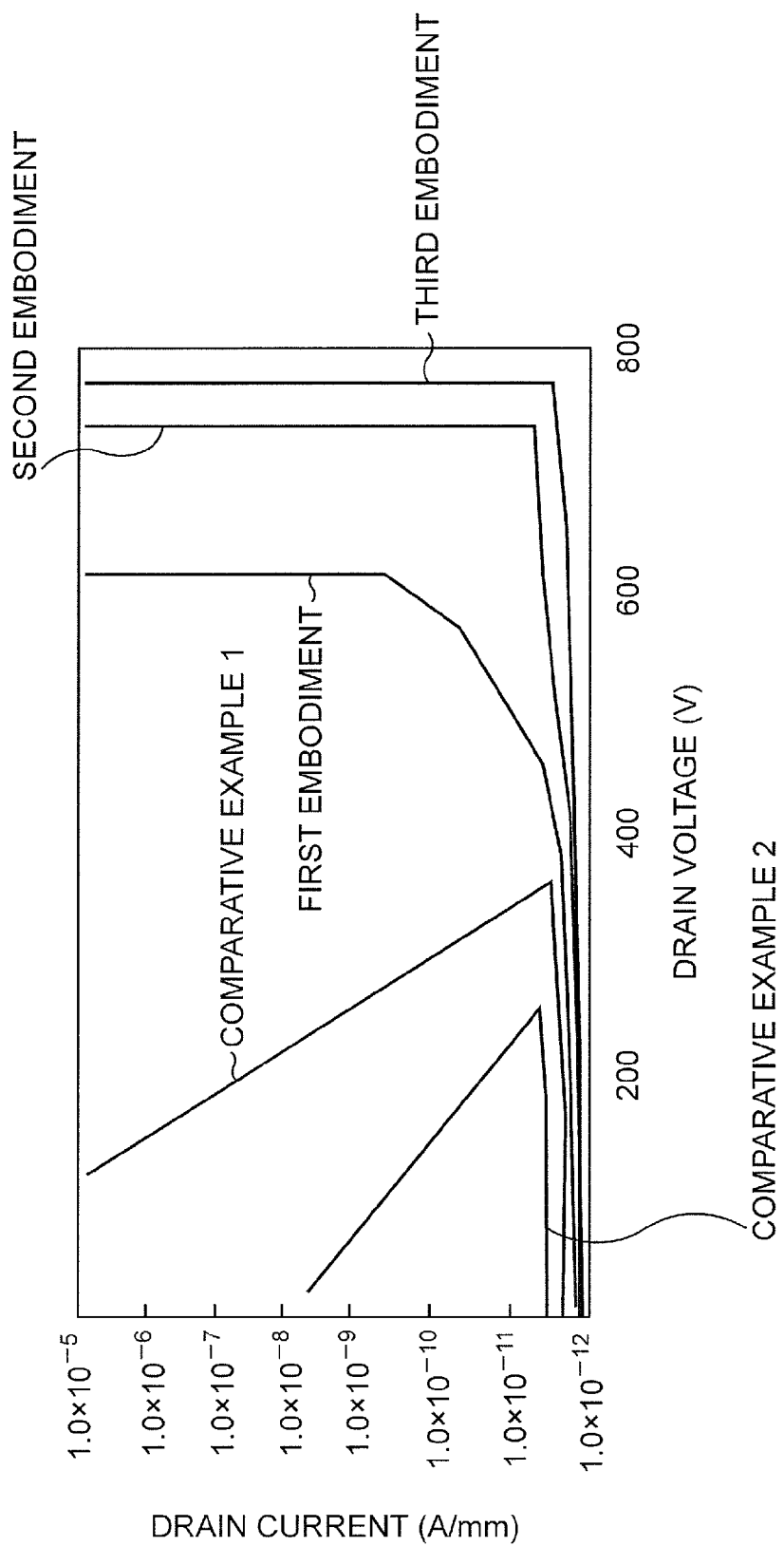
FIG. 13 is a characteristic chart representing results when a change in a drain current is studied by simulation, with a drain voltage being changed in a pinch-off state, regarding the AlGaN/GaN HEMTs according to the first, second, and third embodiments based on comparison with the comparative examples.

Regarding the AlGaN/GaN HEMTs according to the above-described first, second, and third embodiments, a change in a drain current when a drain voltage was changed in a pinch-off state was studied by simulation based on comparison with comparative examples. The results are illustrated in FIG. 13. A comparative example 1 is the AlGaN/GaN HEMT in FIG. 4, and a comparative example 2 is the AlGaN/GaN HEMT in FIG. 5.

In the comparative examples 1, 2, it is seen that holes and electrons are simultaneously generated, and immediately before the breakdown of a drain electrode, snap-back which is a rapid decrease of the drain voltage occurs to promote the breakdown of the drain electrode. On the other hand, in the first, second, and third embodiments, it has been confirmed that the generation of holes is inhibited and no snap-back occurs, enabling a stable high withstand voltage over 600 V.

Fourth Embodiment

In this embodiment, a power supply circuit to which one kind of the AlGaN/GaN HEMT selected from the first to third embodiments is applied is disclosed.

Figure 14:
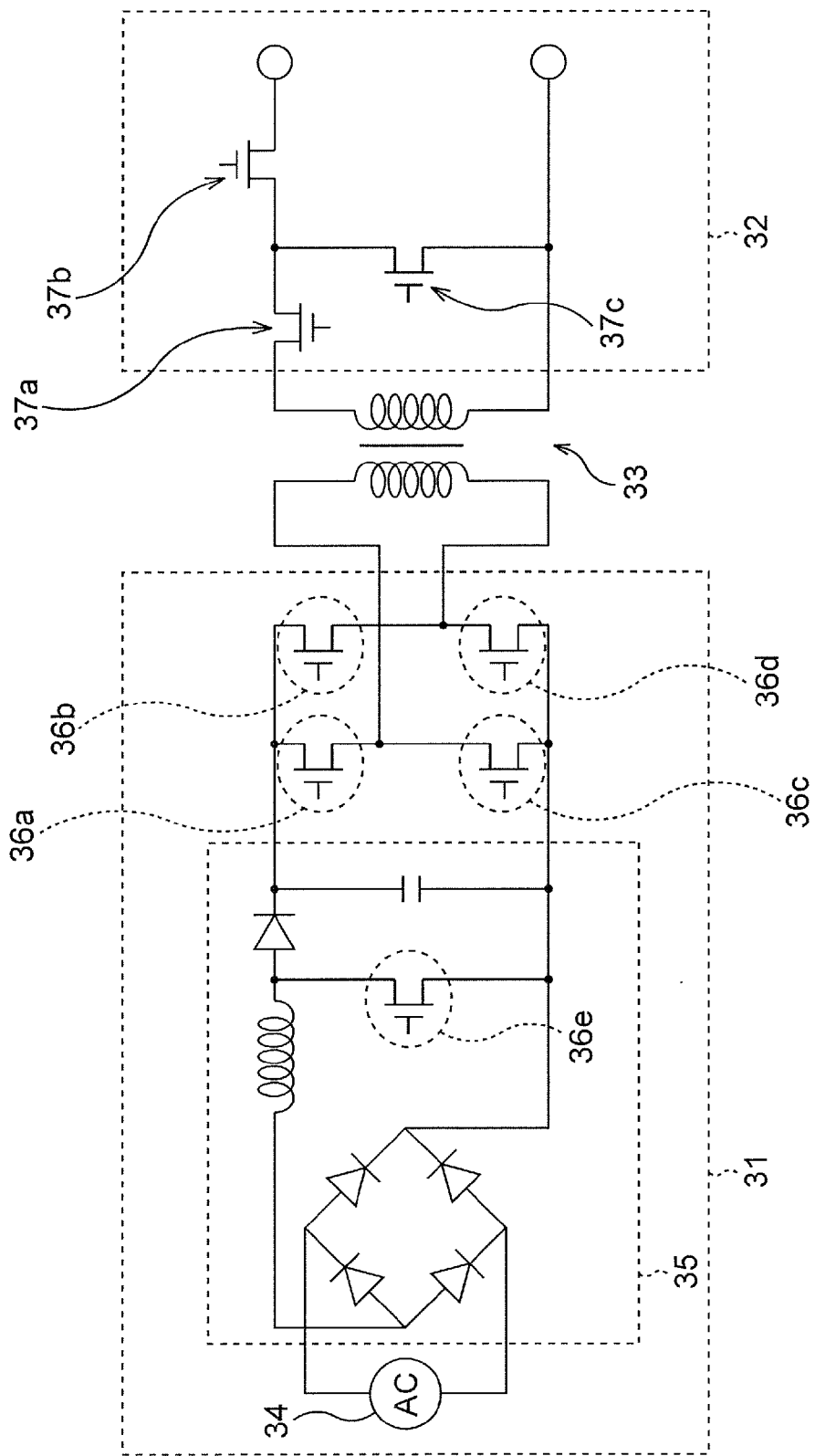
FIG. 14 is a connection diagram illustrating a schematic structure of a power supply circuit according to a fourth embodiment.

FIG. 14 is a connection diagram illustrating a schematic structure of the power supply circuit according to the fourth embodiment.

The power supply circuit according to this embodiment includes a high-voltage primary-side circuit 31, a low-voltage secondary-side circuit 32, and a transformer 33 disposed between the primary-side circuit 31 and the secondary-side circuit 32.

The primary-side circuit 31 includes an AC power source 34, a so-called bridge rectifying circuit 35, and a plurality of (four here) switching elements 36a, 36b, 36c, 36d. Further, the bridge rectifying circuit 35 has a switching element 36e.

The secondary-side circuit 32 includes a plurality of (three here) switching elements 37a, 37b, 37c.

In this embodiment, the switching elements 36a, 36b, 36c, 36d, 36e of the primary-side circuit 31 are each one kind of the AlGaN/GaN HEMT selected from the first to third embodiments. On the other hand, the switching elements 37a, 37b, 37c of the secondary-side circuit 32 are each an ordinary MIS•FET using silicon.

In this embodiment, a highly reliable AlGaN/GaN HEMT that prevents an avalanche effect which is the simultaneous generation of holes and electrons, to inhibit snap-back and realizes a stable high withstand voltage to enable performance improvement and yield improvement is applied to the power supply circuit. Consequently, a highly reliable and high-power power supply circuit is realized.

Fifth Embodiment

In this embodiment, a high-frequency amplifier to which one kind of the AlGaN/GaN HEMT selected from the first to third embodiments is applied is disclosed.

Figure 15:
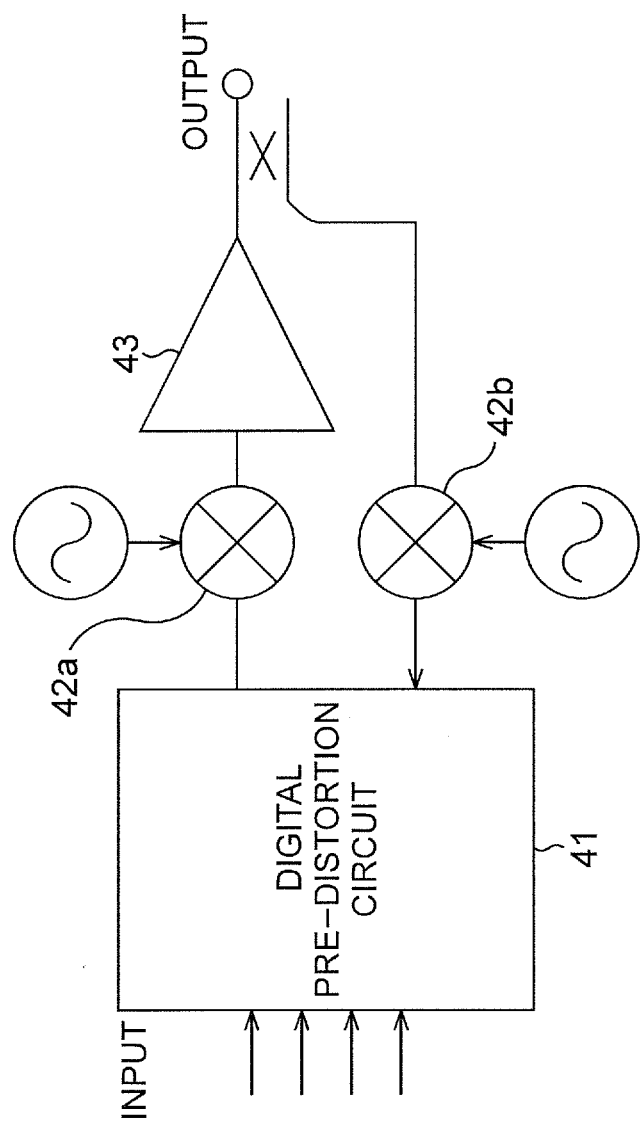
FIG. 15 is a connection diagram illustrating a schematic structure of a high-frequency amplifier according to a fifth embodiment.

FIG. 15 is a connection diagram illustrating a schematic structure of the high-frequency amplifier according to the fifth embodiment.

The high-frequency amplifier according to this embodiment includes a digital pre-distortion circuit 41, mixers 42a, 42b, and a power amplifier 43.

The digital pre-distortion circuit 41 compensates nonlinear distortion of an input signal. The mixer 42a mixes the input signal whose nonlinear distortion is compensated and an AC signal. The power amplifier 43 amplifies the input signal mixed with the AC signal, and has one kind of the AlGaN/GaN HEMT selected from the first to third embodiments. In FIG. 15, by, for example, changing of the switches, an output-side signal can be mixed with the AC signal by the mixer 42b, and the resultant can be sent out to the digital pre-distortion circuit 41.

In this embodiment, a highly reliable AlGaN/GaN HEMT that prevents an avalanche effect which is the simultaneous generation of holes and electrons, to inhibit snap-back and realizes a stable high withstand voltage to enable performance improvement and yield improvement is applied to the high-frequency amplifier. Consequently, a highly reliable and high-withstand-voltage high-frequency amplifier is realized.

Other Embodiments

In the first to fifth embodiments, the AlGaN/GaN HEMT is exemplified as the compound semiconductor device. As the compound semiconductor device, the present invention is applicable to the following HEMTs, besides the AlGaN/GaN HEMT.

Example 1 of Other HEMT

In this example, an InAlN/GaN HEMT is disclosed as the compound semiconductor device.

InAlN and GaN are compound semiconductors whose lattice constants can be made close to each other by the composition. In this case, in the above-described first to fifth embodiments, the electron transit layer is made of i-GaN, the intermediate layer is made of i-InAlN, the electron supply layer is made of n-InAlN, and the cap layer is made of n-GaN. Further, in this case, almost no piezoelectric polarization occurs, and therefore, two-dimensional electron gas is generated mainly by spontaneous polarization of InAlN.

According to this example, a highly reliable and high-withstand-voltage InAlN/GaN HEMT that prevents an avalanche effect which is the simultaneous generation of holes and electrons, to inhibit snap-back and realizes a stable high withstand voltage to enable performance improvement and yield improvement is realized, similarly to the above-described AlGaN/GaN HEMT.

Example 2 of Other HEMT

In this example, an InAlGaN/GaN HEMT is disclosed as the compound semiconductor device.

GaN and InAlGaN are compound semiconductors, with the latter capable of having a smaller lattice constant than that of the former by the composition. In this case, in the above-described first to fifth embodiments, the electron transit layer is made of i-GaN, the intermediate layer is made of i-InAlGaN, the electron supply layer is made of n-InAlGaN, and the cap layer is made of n-GaN.

According to this example, a highly reliable and high-withstand-voltage InAlN/GaN HEMT that prevents an avalanche effect which is the simultaneous generation of holes and electrons, to inhibit snap-back and realizes a stable high withstand voltage to enable performance improvement and yield improvement is realized, similarly to the above-described AlGaN/GaN HEMT.

According to the above-described various embodiments, a highly reliable compound semiconductor device that prevents an avalanche effect which is the simultaneous generation of holes and electrons, to inhibit snap-back and realizes a stable high withstand voltage to enable performance improvement and yield improvement is realized.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device comprising:
a compound semiconductor layer; and
a pair of electrodes formed on an upper side the compound semiconductor layer,
wherein one of the pair of electrodes has three bottom surfaces along transit electrons out of contact surfaces with the compound semiconductor layer, and the three bottom surfaces are located at different distances from the transit electrons, with the bottom surface closest to the other of the pair of electrodes being more apart from the transit electrons; and wherein, in the one of the pair of electrodes, a side surface coupling predetermined adjacent two of the bottom surfaces out of the contact surfaces is in a tapered shape whose portion more apart from the other of the pair of electrodes becomes closer to the transit electrode.

2. The compound semiconductor device according to claim 1, further comprising
a protective insulating film covering the compound semiconductor layer,
wherein, in the one of the pair of electrodes, a contact side surface close to the other of the pair of electrodes out of contact side surfaces with the protective insulating film is coupled to the bottom surface.

3. The compound semiconductor device according to claim 1,
wherein the compound semiconductor layer has an electron transit layer in which the transit electrons are generated and an electron supply layer formed above the electron transit layer, and
wherein the pair of electrodes are in contact with the electron supply layer and not in contact with the electron transit layer.

4. The compound semiconductor device according to claims 1, further comprising:
another electrode formed between the pair of electrodes, above the compound semiconductor layer; and
a p-type semiconductor layer formed between the compound semiconductor layer and the other electrode.

5. A method of manufacturing a compound semiconductor device comprising:
forming a compound semiconductor layer; and
forming a pair of electrodes on an upper side the compound semiconductor layer,
wherein one of the pair of electrodes has three bottom surfaces along transit electrons out of contact surfaces with the compound semiconductor layer, and the three bottom surfaces are located at different distances from the transit electrons, with the bottom surface closer to the other of the pair of electrodes being more apart from the transit electrons; and wherein, in the one of the pair of electrodes, a side surface coupling predetermined adjacent two of the bottom surfaces out of the contact surfaces is in a tapered shape whose portion more apart from the other of the pair of electrodes becomes closer to the transit electrode.

6. The method of manufacturing the compound semiconductor device according to claim 5, further comprising
forming a protective insulating film covering the compound semiconductor layer,
wherein, in the one of the pair of electrodes, a contact side surface close to the other of the pair of electrodes out of contact side surfaces with the protective insulating film is coupled to the bottom surface.

7. The method of manufacturing the compound semiconductor device according to claim 5,
wherein the compound semiconductor layer has an electron transit layer in which the transit electrons are generated and an electron supply layer formed above the electron transit layer, and
wherein the pair of electrodes are in contact with the electron supply layer and not in contact with the electron transit layer.

8. The method of manufacturing the compound semiconductor device according to claim 5, further comprising:
forming another electrode between the pair of electrodes, above the compound semiconductor layer; and
forming a p-type semiconductor layer between the compound semiconductor layer and the other electrode.

* * * * *